(12) United States Patent
Suzuki et al.

(10) Patent No.: US 7,995,343 B2
(45) Date of Patent: Aug. 9, 2011

(54) COOLING UNIT AND ELECTRONIC DEVICE

(75) Inventors: Kenji Suzuki, Kawasaki (JP); Tadanori Tachikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/458,685

(22) Filed: Jul. 20, 2009

(65) Prior Publication Data

US 2010/0073875 A1 Mar. 25, 2010

(30) Foreign Application Priority Data

Sep. 22, 2008 (JP) ................... 2008-243238

(51) Int. Cl.
  *H05K 7/20* (2006.01)
  *G06F 1/20* (2006.01)

(52) U.S. Cl. .............. 361/699; 361/679.47; 361/679.48; 361/679.53; 361/679.54; 361/679.55; 361/695; 361/698; 361/701; 361/703; 361/704; 165/80.2; 165/80.3; 165/104.33; 165/185

(58) Field of Classification Search .......... 361/679.47–679.48, 679.53–679.55, 694–695, 361/697–699, 702–704, 709; 165/80.2–80.5, 165/104.33, 185; 174/15.2, 16.1, 16.3

See application file for complete search history.

(56) References Cited

U.S. PATENT DOCUMENTS

| | | | |
|---|---|---|---|
| 6,519,147 B2 * | 2/2003 | Nakagawa et al. | 361/679.52 |
| 6,697,253 B2 * | 2/2004 | Minamitani et al. | 361/679.21 |
| 6,791,834 B2 * | 9/2004 | Nakagawa et al. | 361/679.33 |
| 6,808,014 B2 * | 10/2004 | Minamitani et al. | 165/80.4 |
| 6,873,525 B2 * | 3/2005 | Minamitani et al. | 361/679.53 |
| 6,972,954 B2 * | 12/2005 | Minamitani et al. | 361/679.53 |
| 7,203,063 B2 * | 4/2007 | Bash et al. | 361/699 |
| 2007/0012423 A1 | 1/2007 | Kinoshita et al. | |
| 2009/0009968 A1 * | 1/2009 | Hongo | 361/699 |

FOREIGN PATENT DOCUMENTS

| | | |
|---|---|---|
| JP | 2005-011928 | 1/2005 |
| JP | 2007-027340 | 2/2007 |

* cited by examiner

*Primary Examiner* — Robert J Hoffberg
(74) *Attorney, Agent, or Firm* — Fujitsu Patent Center

(57) ABSTRACT

A cooling unit includes: a heat-radiating section in which a coolant flows and which radiates heat caught by the coolant; and a path where the coolant flows through the heat-radiating section; a pump on the path to cause the coolant to flow; and heat absorbing sections disposed on the path to touch heat-producing elements having different heating values, in which the coolant runs to absorb heat produced by the heat-producing elements. One of the heat-absorbing sections is a maximum-heat-absorbing section that touches a maximum-heat-producing element and is disposed downstream from the pump and upstream from the heat-radiating section in a flow of the coolant on the path. Another one of the heat absorbing sections is a low-heat absorbing section that touches the heat-producing element except the maximum-heat-producing element and is disposed upstream from the pump and downstream from the heat-radiating section in the flow of the coolant on the path.

12 Claims, 32 Drawing Sheets

COOLING UNIT AND ELECTRONIC DEVICE

CROSS-REFERENCE TO RELATED APPLICATION

This application is based upon and claims the benefit of priority of the prior Japanese Patent Application No. 2008-243238, filed on Sep. 22, 2008, the entire contents of which are incorporated herein by reference.

FIELD

The embodiments discussed herein are related to a cooling unit for cooling a heat-producing element such as an electronic component which produces heat while executing processes, and also related to an electronic device equipped with such a cooling unit.

BACKGROUND

Many of electronic devices having information processing functions, typified by a personal computer and the like, include electronic components, such as a CPU, which produce heat while executing processes. The electronic component itself such as a CPU is a heat-producing element and may cause malfunction when a temperature thereof is excessively increased. Thus, generally, most of the electronic devices such as personal computers are internally equipped with some kind of means for cooling an electronic component such as a CPU. As one of such cooling units, there is known a cooling unit for cooling a heat-producing element by means of a coolant (see, for example, Japanese Laid-open Patent Publication No. 2005-11928).

Many of electronic devices such as a personal computer are provided with, in addition to a CPU, other types of electronic components that produce heat while executing processes, such as a chipset for controlling data communications in a CPU and a memory. In recent years, due to an increase in processing capacity of electronic devices such as personal computers, heat-producing components other than a CPU have been already well on their ways to becoming hard to ignore. For this reason, there is proposed a technique for cooling two or more heat-producing elements by means of a cooling unit employing a coolant like the one mentioned above (see, for example, Japanese Laid-open Patent Publication No. 2007-27340).

The cooling unit that cools two or more heat-producing elements using a coolant as mentioned above is provided with: two or more heat absorbing sections that allow the coolant running inside to absorb heat; a heat radiating section that radiates the heat accumulated in the coolant to the outside; and a pump or the like that causes the coolant to flow. In this type of cooling unit, there is formed a path that links the heat absorbing sections, the heat radiating section and the pump.

Conventionally, in many of ordinary cooling units using a coolant, the coolant in a state of having the lowest temperature upon leaving a heat radiating section is first made to flow to a heat absorbing section that absorbs heat produced by a heat-producing element with the highest heating value such as a CPU. Meanwhile, in many of pumps used for circulating a coolant, an upper limit below which circulation of the coolant is allowed is set to the temperature of the coolant in view of resistance to heat. Lately however, since the heating value has been greatly increased due to an increase in the processing speed of a CPU or the like, there is a high possibility that the temperature of the coolant may exceed the upper limit set in the pump, as a result of being warmed by heat produced by the CPU. To this end, conventionally, the coolant upon leaving a heat radiating section is first made to pass through a heat absorbing section to absorb heat produced by a CPU or the like, and then temporarily cooled before sent to a pump to lower the temperature that has been increased as a result of absorbing the heat from the CPU. This requires a complicated path, which not only makes it difficult to mount a cooling unit on an electronic device, but also reduces cooling efficiency in the cooling unit because the path needs to be long.

SUMMARY

According to an aspect of the invention, a cooling unit includes: a heat radiating section in which a coolant flows and which radiates heat caught by the coolant to the outside; a path in which the coolant flows and circulates the coolant so that the coolant leaves the heat radiating section and returns to the heat radiating section; a pump disposed on the path and causing the coolant in the path to flow along the path; and a plurality of heat absorbing sections disposed at respective points on the path and respectively touching a plurality of heat-producing elements having different heating values, the heat absorbing sections allowing the coolant to run inside thereof and absorb heat produced by the heat-producing elements, one of the heat absorbing sections being a maximum-heat absorbing section that touches a maximum-heat producing element among the heat-producing elements and is disposed downstream from the pump and upstream from the heat radiating section in a flow of the coolant on the path, at least another one of the heat absorbing sections being a low-heat absorbing section that touches the heat-producing elements except for the maximum-heat producing element and is disposed upstream from the pump and downstream from the heat radiating section in the flow of the coolant on the path.

According to the cooling unit described above, the maximum-heat absorbing section is disposed downstream from the pump. Therefore, even when the temperature of the coolant that has passed through the maximum-heat absorbing section exceeds the upper limit set in the pump, such a high temperature does not exert any influence on the pump. Thanks to this structure, the cooling unit described above forms a path that links elements arranged in a simple order, for example, a sequence formed by the heat radiation section, the low-heat absorbing section, the pump, the maximum-heat absorbing section, and again the heat radiation section. Accordingly, the shortest path is realized and two or more heat-producing elements are efficiently cooled in the cooling unit described above.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

With reference to the drawings, description will be given below of a specific embodiment.

An embodiment of an electronic device described below is a so-called notebook personal computer and has a structure in which a main unit and a display unit are connected to each other so as to be opened and closed. The main unit includes a keyboard and the like, and processes various kinds of information. The display unit displays images and the like.

Figure 1:
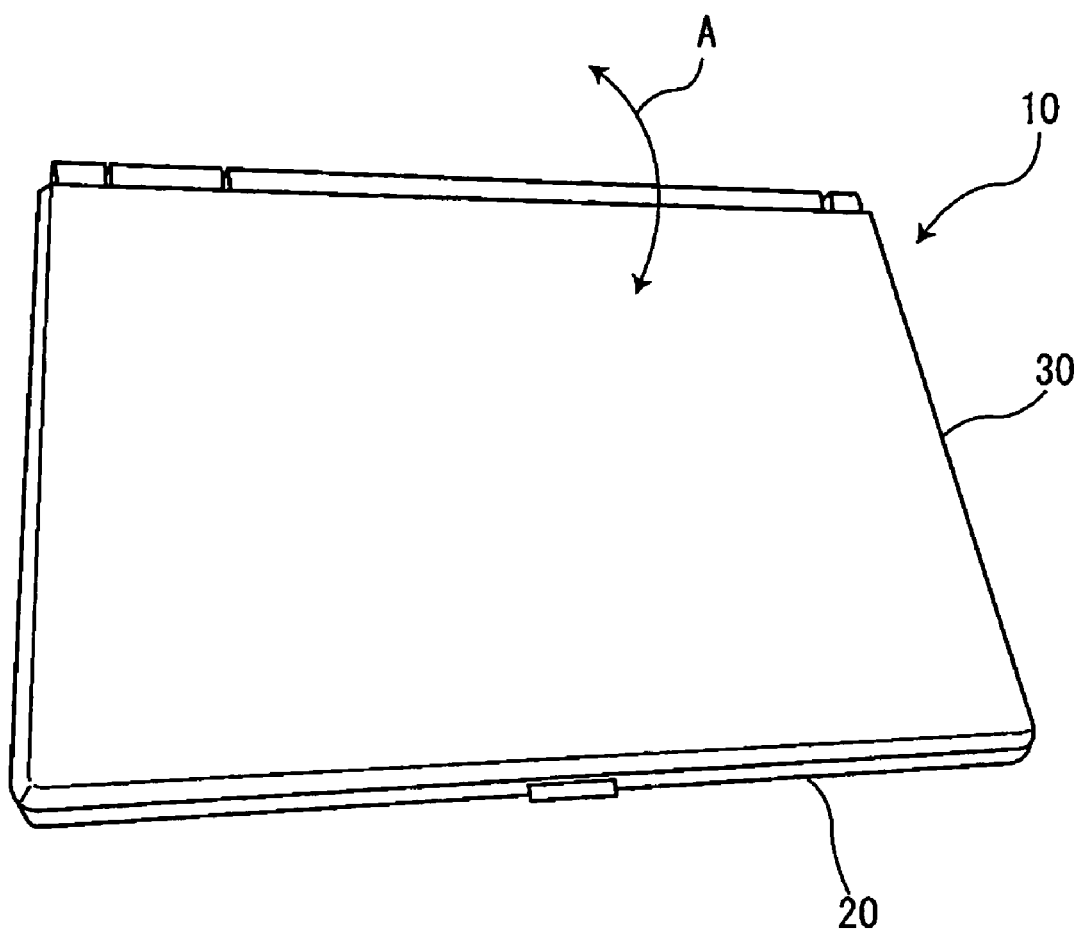
FIG. 1 is an external view of a personal computer in a state (closed state) where a display unit is closed with respect to a main unit.
Figure 2:
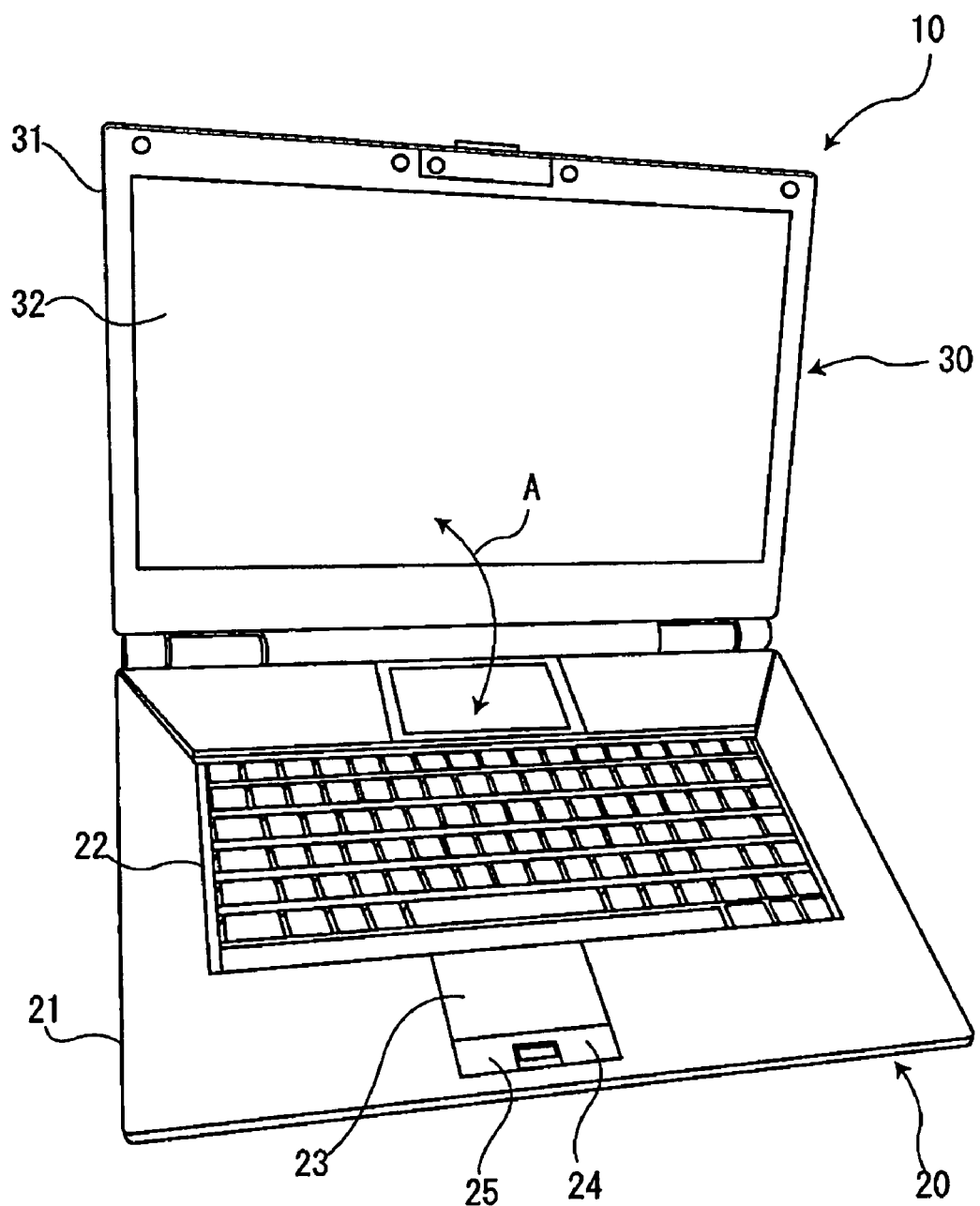
FIG. 2 is an external view of the personal computer in a state (open state) where the display unit is opened with respect to the main unit.

FIG. 1 is an external view of the personal computer in a state (closed state) where the display unit is closed with respect to the main unit. FIG. 2 is an external view of the personal computer in a state (open state) where the display unit is opened with respect to the main unit.

This personal computer 10 includes a main unit 20 and a display unit 30 as described above. The main unit 20 and the display unit 30 are connected so that the display unit 30 is opened and closed in an arrow A direction with respect to the main unit 20.

The main unit 20 of the personal computer 10 has components such as a hard disk drive and various boards housed in a main-unit housing 21. Further, the main unit 20 includes, on its upper surface, a keyboard 22 having multiple keys arranged thereon, a track pad 23, a right-click button 24 and a left-click button 25.

The display unit 30 of the personal computer 10 displays results of information processing executed by the main unit 20. The display unit 30 has a flat liquid crystal panel 32, a control circuit for the liquid crystal panel 32 and the like housed in a display housing 31.

Figure 3:
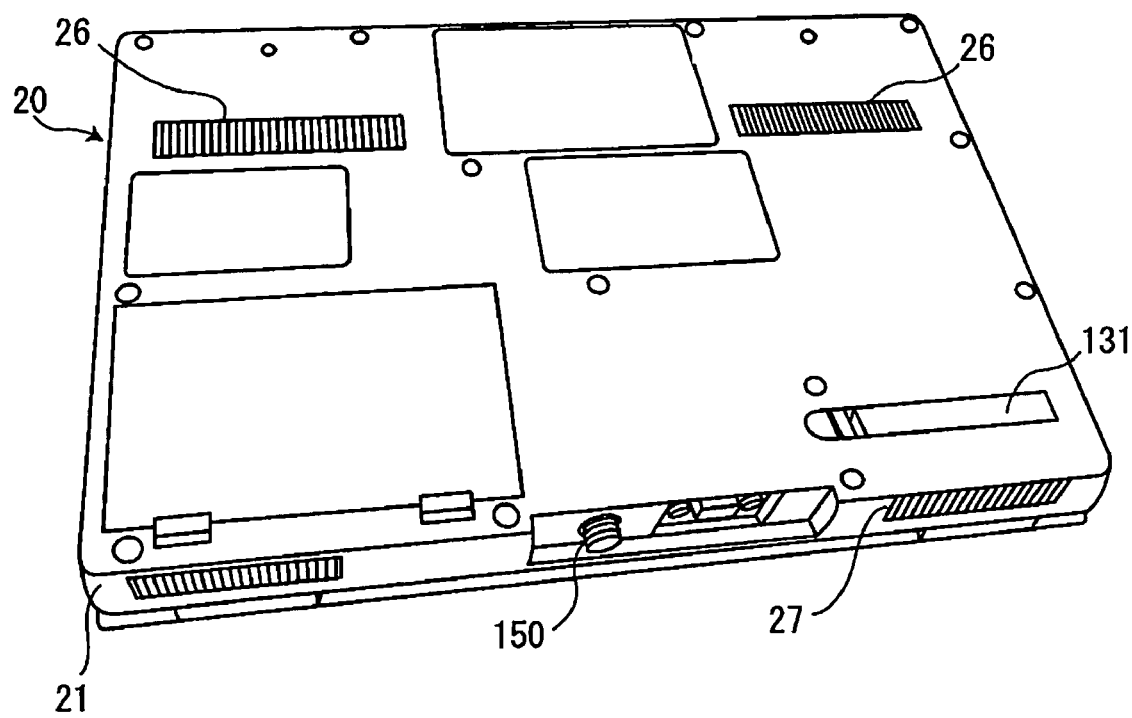
FIG. 3 is an external view of the personal computer in the closed state as illustrated in FIG. 1, where the undersurface of the main unit is seen, with the display unit down.

FIG. 3 is an external view of the personal computer in the closed state as illustrated in FIG. 1, illustrating a state where the undersurface of the main unit is seen, with the display unit down.

Note that FIG. 3 illustrates the rear of the personal computer 10 directed frontward in contrast to FIGS. 1 and 2.

The personal computer 10 of this embodiment, to be described later, uses a cooling unit for cooling with air various electronic components in the main unit 20. As illustrated in FIG. 3, the main unit 20 includes an inlet 26 on its lower surface. From the inlet 26, cooling air is taken into the main unit 20. The cooling unit allows the cooling air to absorb heat produced by the various electronic components so as to cool the various electronic components. As a result, the air thus warmed is discharged to the outside of the main unit 20 from an outlet 27 provided in the rear of the main unit 20.

Moreover, in this embodiment, a dust filter 131 for removing dust from the air used for cooling in the cooling unit is detachably attached to the main-unit housing 21.

Figure 4:
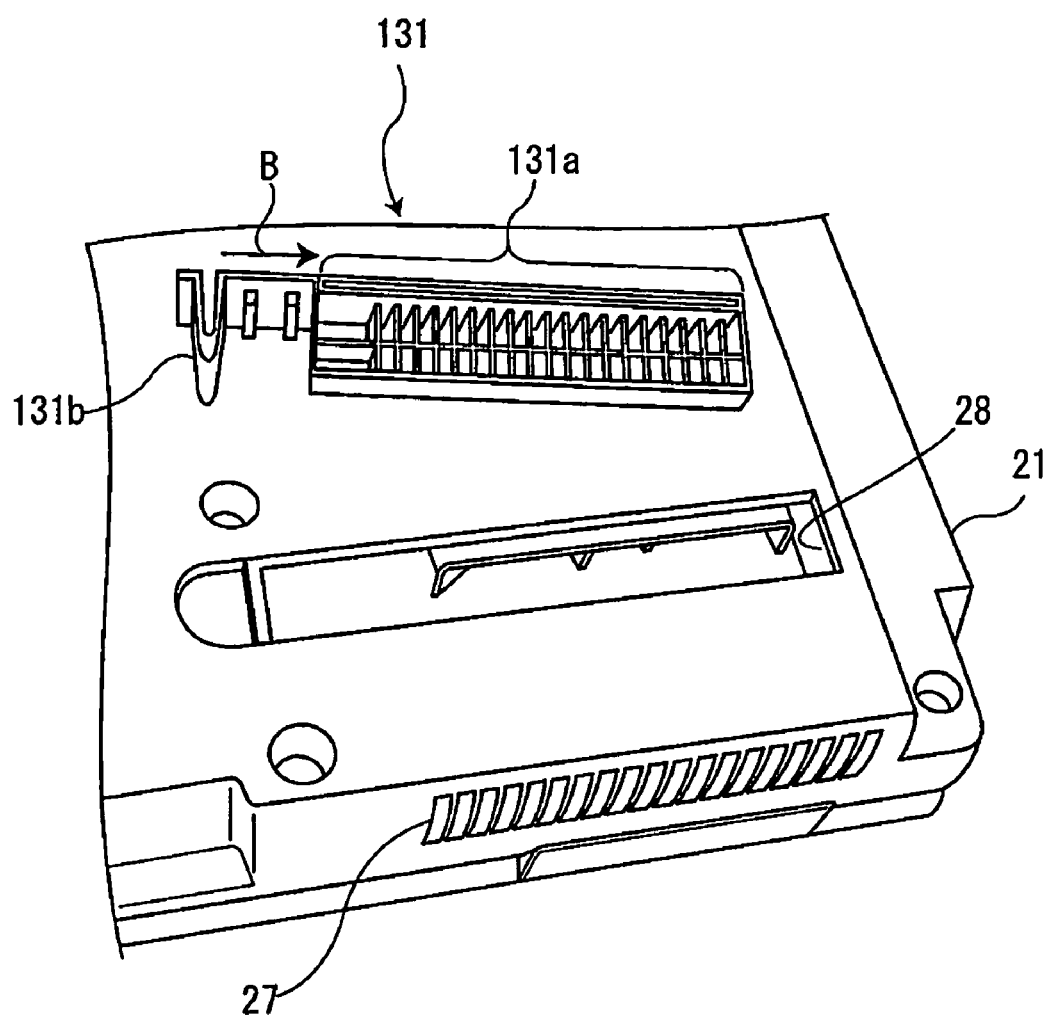
FIG. 4 illustrates a state where a dust filter illustrated in FIG. 3 is detached.

FIG. 4 illustrates a state where the dust filter illustrated in FIG. 3 is detached.

As illustrated in FIG. 4, the dust filter 131 includes a filter main body 131a having multiple ribs arranged in a lattice pattern. This filter main body 131a removes dust from the air flowing toward the outlet 27.

The main-unit housing 21 has, in its lower surface, an opening 28 extended parallel to the outlet 27. The dust filter 131 is inserted into the opening 28. Meanwhile, the dust filter 131 has a leaf spring 131b which biases the filter main body 131a in a longitudinal direction indicated by an arrow B. When the dust filter 131 is inserted into the opening 28, the leaf spring 131b presses the filter main body 131a against the main-unit housing 21 in the longitudinal direction indicated by the arrow B. The action by the leaf spring 131b of pressing the filter main body 131a fixes the dust filter 131 to the main-unit housing 21. Moreover, a user may detach the dust filter 131 from the main-unit housing 21 by pushing the leaf spring 131b with his/her finger and pulling the leaf spring 131b out from the main-unit housing 21.

In this embodiment, the dust filter 131 may be easily detached from the main-unit housing 21 in this manner. Thus, the dust filter 131 may be cleaned as appropriate to avoid clogging of the dust filter 131 and the like.

Figure 5:
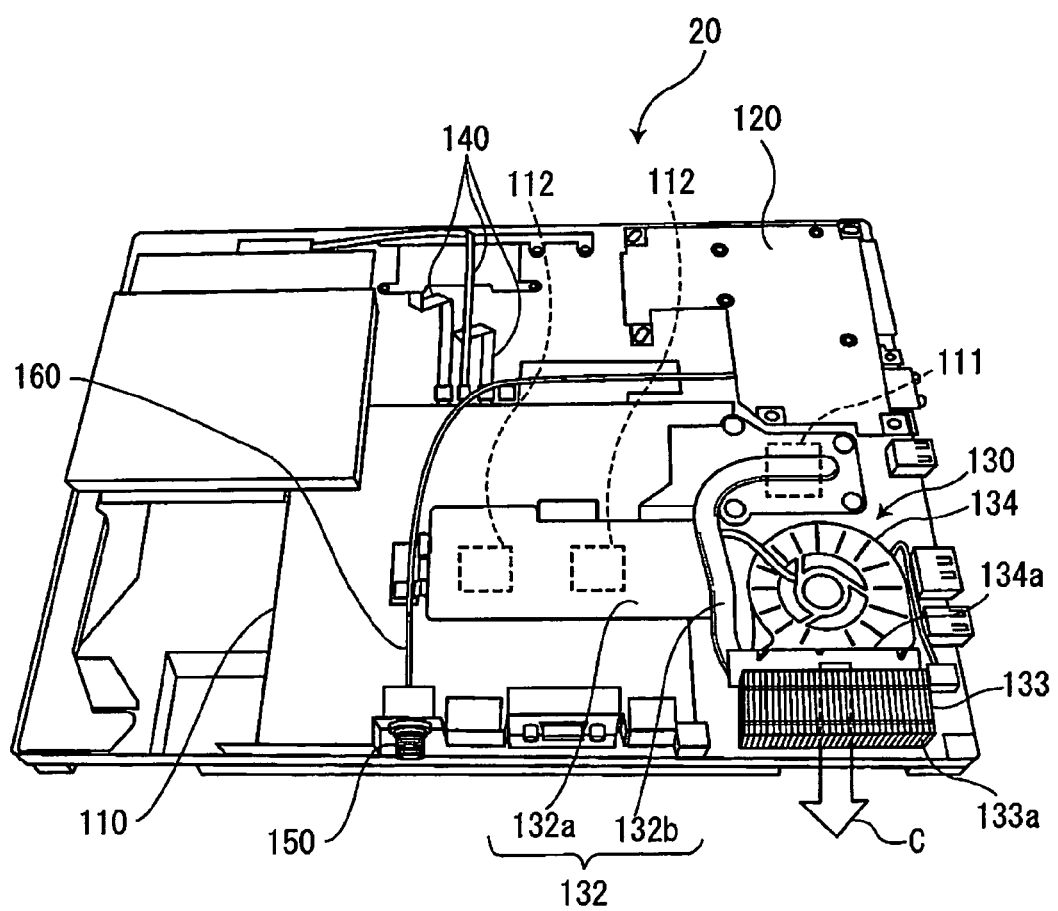
FIG. 5 illustrates a state where a panel serving as the lower surface of the main unit illustrated in FIG. 4 is detached and thus an internal structure of the main unit is exposed.

FIG. 5 illustrates a state where a panel serving as the lower surface of the main unit illustrated in FIG. 4 is detached and thus an internal structure of the main unit is exposed.

Note that, in FIG. 5, the display unit 30 and the dust filter 131 are also removed.

As illustrated in FIG. 5, the main unit 20 has a main board 110, a sub-board 120 and the like housed therein. The main board 110 is a large-size board having various electronic components mounted thereon, such as a CPU 111 for performing overall control of the personal computer 10 and chipsets 112 for controlling data communication and the like in the CPU 111 and the like. The sub-board 120 is connected to the main board 110 through a connector and has an antenna module to be described later and the like mounted thereon.

The CPU 111 and the chipsets 112 mounted on the main board 110 produce heat while executing signal processing. Therefore, those components are preferably constantly cooled during operations of the personal computer 10 in order to avoid malfunction or the like due to the heat thus produced. In this embodiment, for cooling the CPU 111 and the chipsets 112, a cooling unit 130 to be described below is mounted on the main unit 20.

The cooling unit 130 includes a heat transfer section 132 having a heat absorbing plate 132a made of copper. The heat absorbing plate 132a comes into contact with the CPU 111 and the two chipsets 112 to absorb heat produced by those components. The heat transfer section 132 also has a heatpipe 132b for transferring the heat absorbed by the heat absorbing plate 132a to a heat radiating section 133 to be described later. In the cooling unit 130, the heat transfer section 132 brings the heat produced by the CPU 111 and the two chipsets 112 into the heat radiating section 133.

The heat radiating section 133 has a structure in which metal fins 133a are arranged at predetermined intervals in a ventilator through which the air passes. Here, the ventilator defines a ventilation area. The heat transferred to the heat radiating section 133 by the heat transfer section 132 comes to the fins 133a included in the heat radiating section 133.

The cooling unit 130 further includes a fan 134 for blowing air in a direction indicated by an arrow C so as to allow the air to flow between the fins 133a in the heat radiating section 133. The air blown by the fan 134 passes between the fins 133a so that the heat coming to the fins 133a is radiated into the air. The air warmed by the heat radiation is discharged from the outlet 27 illustrated in FIGS. 3 and 4.

In this event, if some of the air blown over the heat radiating section 133 leaks to the surrounding without passing between the fins 133a, cooling efficiency of the fins 133a is lowered. This lowered cooling efficiency of the fins 133a eventually causes a decrease in efficiency of cooling the CPU 111 and the chipsets 112.

Here, in this embodiment, the dust filter 131 illustrated in FIGS. 3 and 4 is disposed such that the filter main body 131a is inserted through the opening 28 illustrated in FIG. 4 to be placed between the heat radiating section 133 and a blowing opening 134a. The blowing opening 134a is directed toward the heat radiating section 133 so that the air pushed by the fan 134 comes out through the blowing opening 134a.

Figure 6:
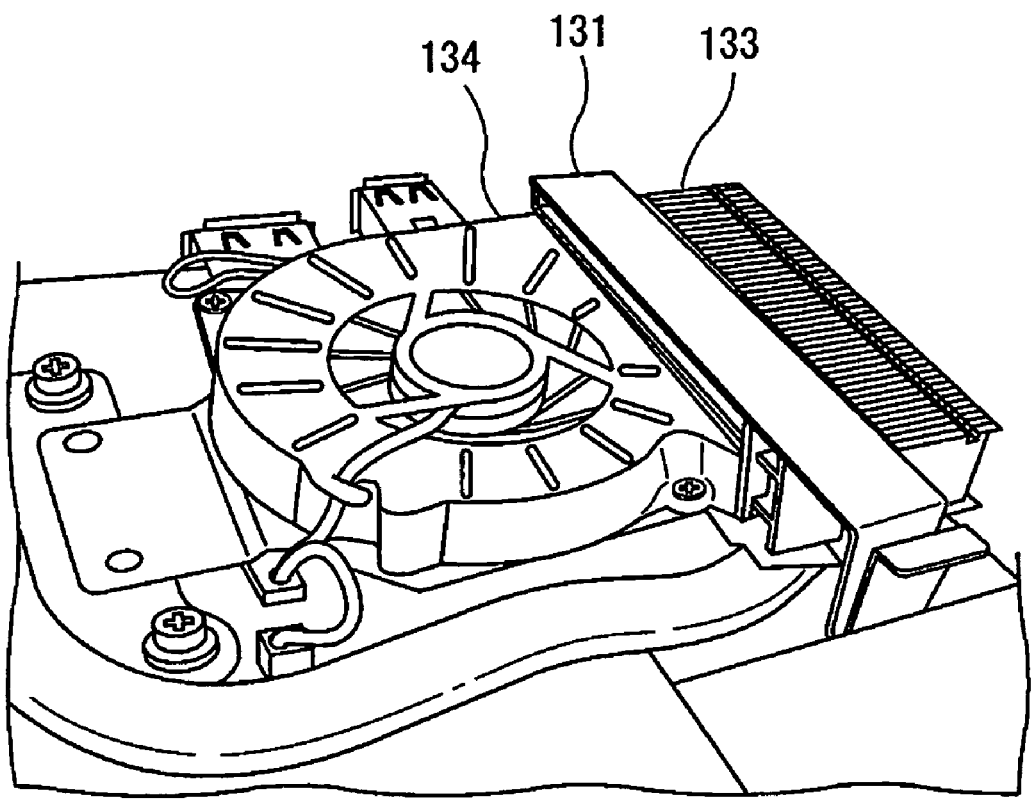
FIG. 6 illustrates a state where the dust filter is placed so as to have its filter main body inserted between a blowing opening of a fan and a heat radiating section.

FIG. 6 illustrates a state where the dust filter is placed so as to have the filter main body inserted between the blowing opening of the fan and the heat radiating section.

The filter main body 131a of the dust filter 131 removes dust from the air blown toward the heat radiating section 133 by the fan 134. Thus, clogging between the fins 133a in the heat radiating section 133 or the like is avoided. However, the filter main body 131a resists the air blown toward the heat radiating section 133. Therefore, some of the air hitting the filter main body 131a tends to veer off the direction heading toward the heat radiating section 133. Here, in this embodiment, the filter main body 131a of the dust filter 131 also serves as a part of a duct wall which surely guides the air from the fan 134 to the spaces between the fins 133a included in the heat radiating section 133 while preventing air leaks to the surrounding. Meanwhile, a wall surface or the like of the main-unit housing 21 forms a different portion of the duct wall, which also helps forcibly guide the air that tends to veer toward the heat radiating section 133. Thus, a decrease in cooling efficiency is prevented.

Moreover, this embodiment employs a commercially available fan as the fan 134 included in the cooling unit 130 and commercially available radiating fins as the heat radiating section 133, so that a cost reduction is achieved. However, this has resulted in the differences in size and position between the blowing opening 134a in the fan 134 and the heat radiating section 133, which will be described below.

Figure 7:
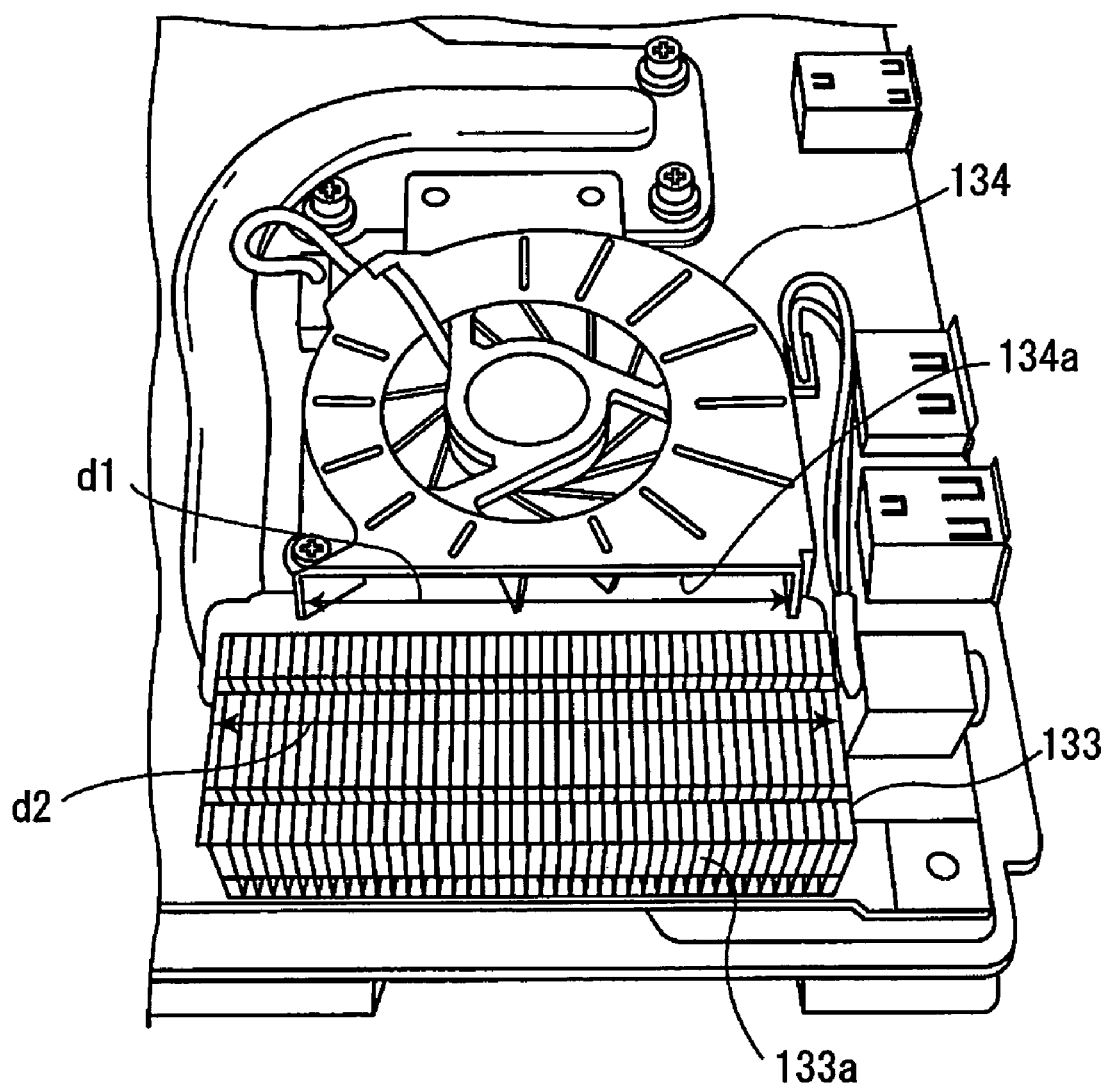
FIG. 7 is an enlarged view of the fan and the heat radiating section in a cooling unit illustrated in FIG. 5.

FIG. 7 is an enlarged view of the fan and the heat radiating section in the cooling unit illustrated in FIG. 5.

As illustrated in FIG. 7, in this embodiment, a width d1 of the blowing opening 134a is smaller than a width d2 of the heat radiating section 133. Moreover, the position of the right side surface of the blowing opening 134a is shifted from the position of the right side surface of the heat radiating section 133. Furthermore, the position of the left side surface of the blowing opening 134a is also shifted from the position of the left side surface of the heat radiating section 133.

Therefore, in this embodiment, in order to allow the filter main body 131a of the dust filter 131 to serve as a part of the duct wall, a shape of the dust filter 131 is designed as described below to guide the air blown out of the blowing opening 134a to the spaces between the fins 133a included in the heat radiating section 133.

Figure 8:
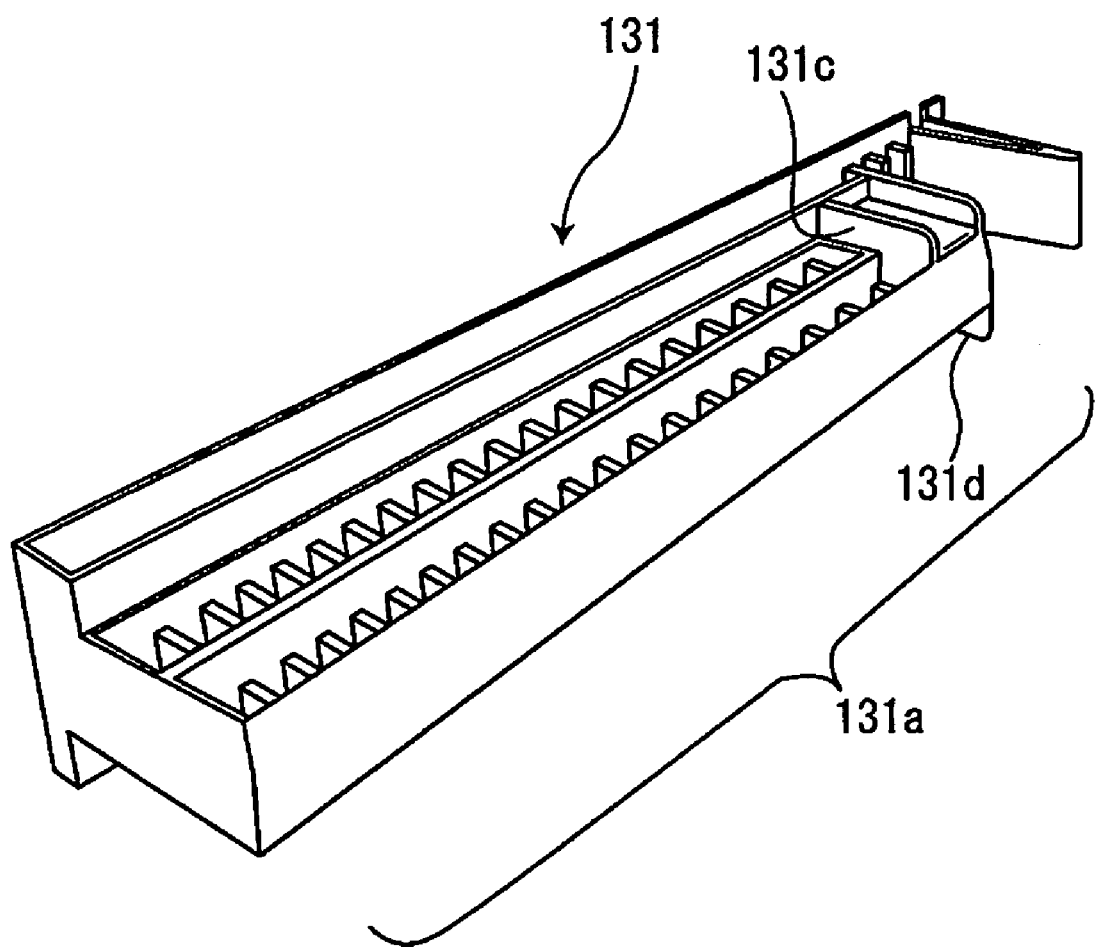
FIG. 8 is an enlarged view of the dust filter.

FIG. 8 is an enlarged view of the dust filter.

FIG. 8 illustrates the dust filter 131 with a side to contact the blowing opening 134a facing upward and a side to contact the heat radiating section 133 facing downward.

In this embodiment, the filter main body 131a of the dust filter 131 includes two shielding ribs, a shielding rib 131c on the fan side and a shielding rib 131d on the heat radiating section side, as shielding ribs for preventing the air blown out of the blowing opening 134a from leaking laterally. The shielding rib 131c protrudes along the side surface of the fan 134 toward the fan 134 from the side of the filter main body 131a that comes into contact with the blowing opening 134a. The shielding rib 131c is provided at a position corresponding to the width d1 of the blowing opening 134a illustrated in FIG. 7. Moreover, the shielding rib 131d protrudes along the side surface of the heat radiating section 133 toward the heat radiating section 133 from the side of the filter main body 131a coming into contact with the heat radiating section 133. The shielding rib 131d is provided at a position corresponding to the width d2 of the heat radiating section 133 illustrated in FIG. 7.

Figure 9:
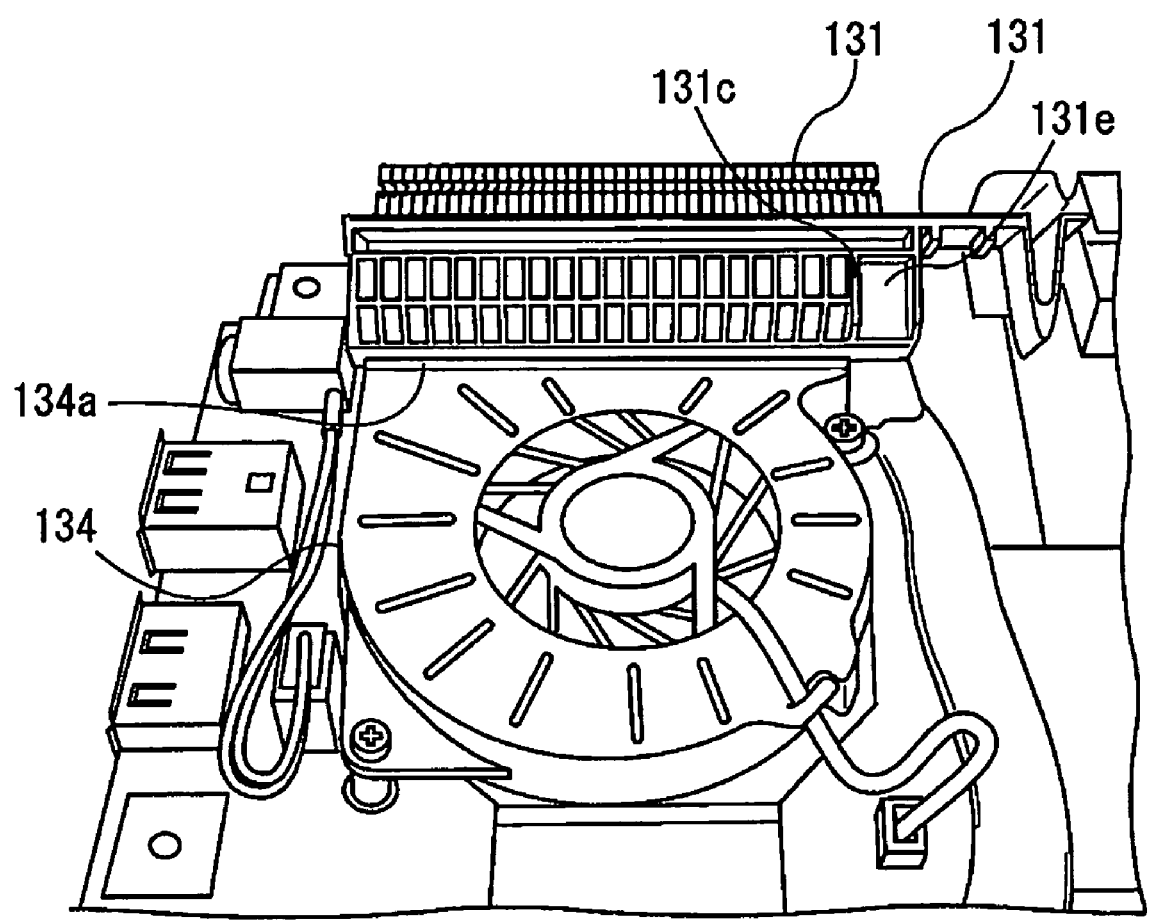
FIG. 9 illustrates a state where the dust filter and the fan are arranged.
Figure 10:
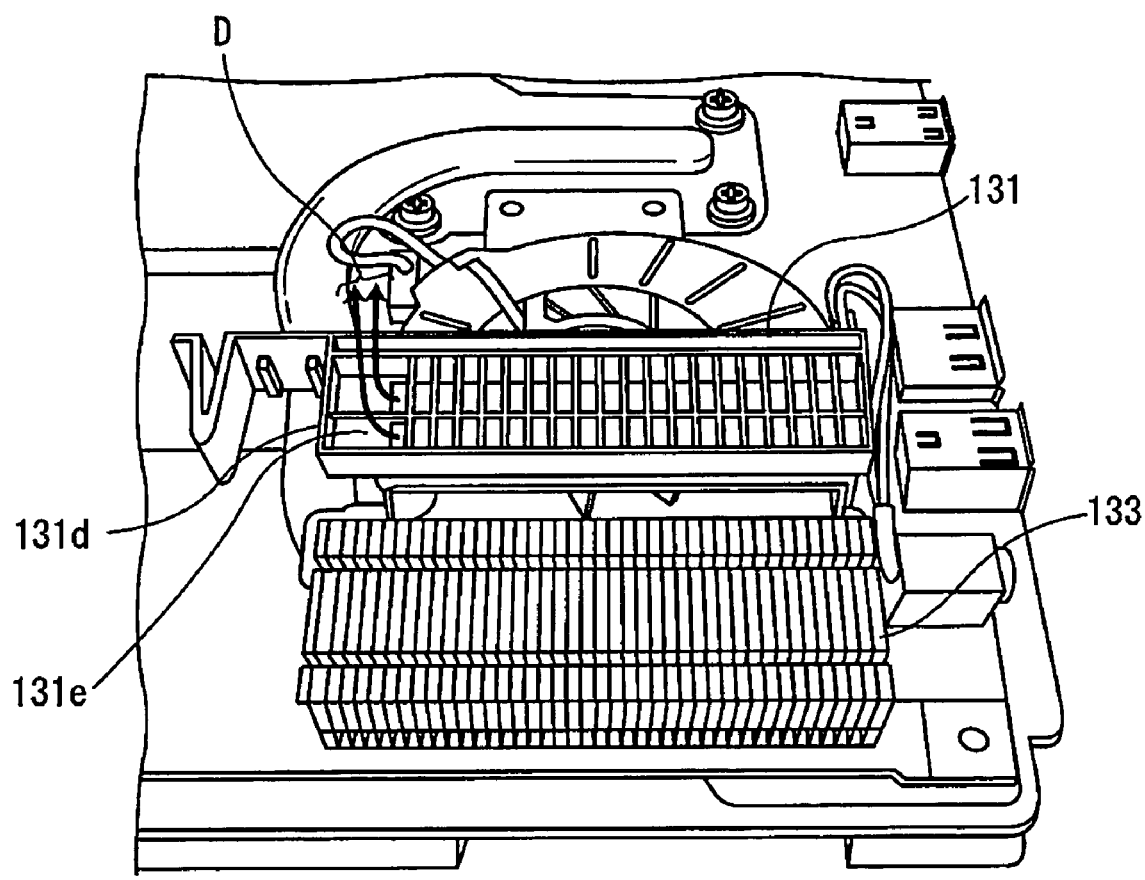
FIG. 10 illustrates a state where the dust filter and the heat radiating section are arranged.

FIG. 9 illustrates a state where the dust filter and the fan are arranged. FIG. 10 illustrates a state where the dust filter and the heat radiating section are arranged.

As illustrated in FIG. 9, the shielding rib 131c is provided at a position slightly outside the edge of the blowing opening 134a. As a result, the filter main body 131a of the dust filter 131 is provided with an air inlet of a size and a position corresponding to those of the blowing opening 134a of the fan 134 so that the air blown out of the blowing opening 134a is taken into the filter main body 131a without any leak.

Moreover, as illustrated in FIG. 10, the shielding rib 131d is provided at a position slightly outside the edge of the heat radiating section 133. Furthermore, a blocking plate 131e is provided between the shielding rib 131c and the shielding rib 131d. Thus, as illustrated in FIG. 10, the air passing near the shielding rib 131c flows in a direction indicated by an arrow D and heads toward the heat radiating section 133 without leaking. In this structure, the filter main body 131a of the dust filter 131 is provided with an air outlet of a size and a position corresponding to those of a portion of the heat radiating section 133 onto which the air is blown, so that the air taken into the filter main body 131a flows toward the heat radiating section 133.

As described above with reference to FIGS. 6 to 10, in the cooling unit 130 of this embodiment, the filter main body 131a of the dust filter 131 has the air inlet of the size and the position corresponding to those of the blowing opening 134a of the fan 134 and the air outlet of the size and the position corresponding to those of the portion of the heat radiating section 133 onto which the air is blown. Thus, the filter main body 131a serves as a part of the wall of the duct which takes in the air blown out of the blowing opening 134a without any leak and guides the air to the heat radiating section 133. As a result, the CPU 111 and the chipsets 112 illustrated in FIG. 5 are efficiently cooled.

Note that, there has been described the cooling unit 130, illustrated in FIG. 5, of the type using the heat pipe 132b to transfer the heat to the heat radiating section, as an example of the cooling unit for cooling the CPU 111 and the chipsets 112. However, the cooling unit for cooling the CPU 111 and the chipsets 112 is not limited to this type of cooling unit but may be of a different type which transfers the heat to the heat radiating section by circulating a coolant. This different type of cooling unit will be described below. Note that this different type of cooling unit will be hereinafter called a second cooling unit.

Figure 11:
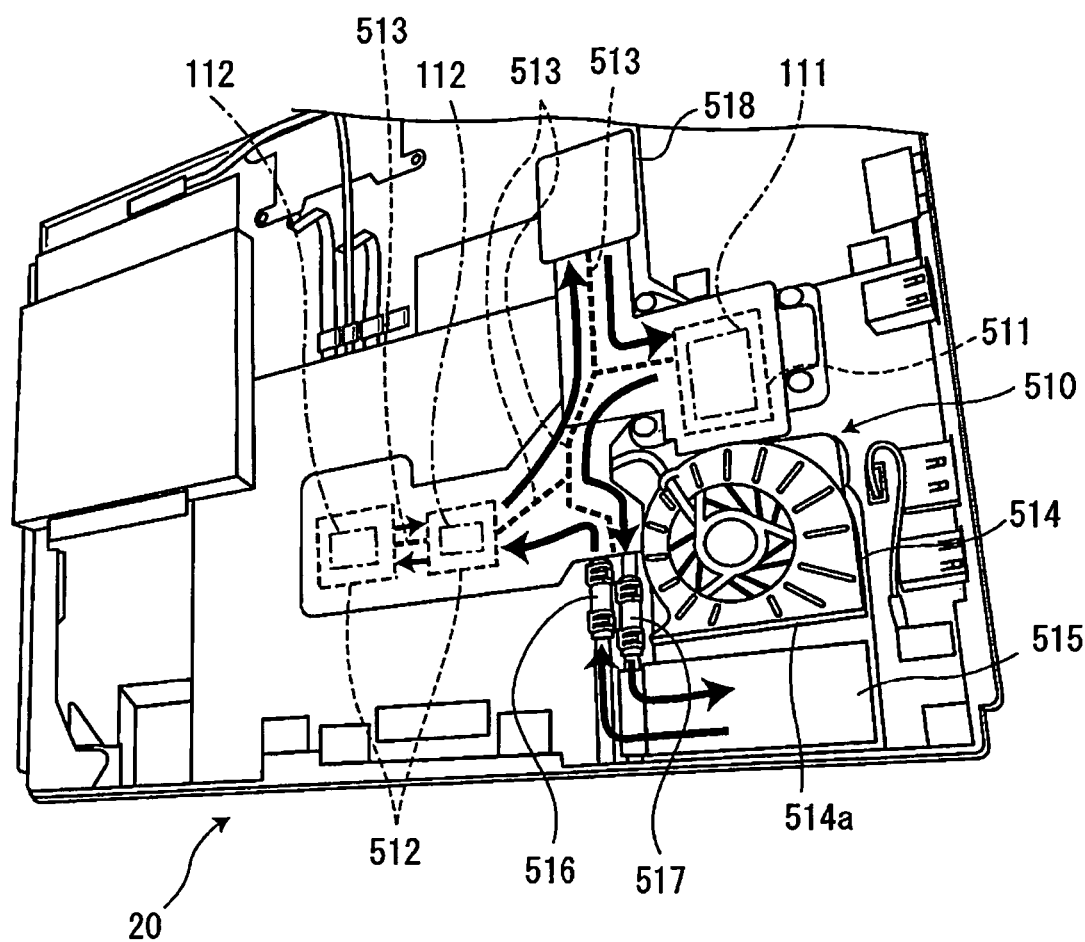
FIG. 11 illustrates a main unit of another embodiment in which the cooling unit in the main unit illustrated in FIG. 5 is replaced with another type of cooling unit which transfers heat to a heat radiating section by circulating a coolant.

FIG. 11 illustrates a main unit of another embodiment in which the cooling unit in the main unit illustrated in FIG. 5 is replaced with a second cooling unit which transfers heat to a heat radiating section by circulating a coolant.

A main unit 20' of the another embodiment illustrated in FIG. 11 has a second cooling unit 510 mounted thereon, which transfers heat to a heat radiating section by circulating a coolant, the second cooling unit being of a type different from that of the cooling unit 130 illustrated in FIG. 5.

The second cooling unit 510 includes one CPU heat absorbing section 511 and two chipset heat absorbing sections 512, which are metal heat absorbing sections in which the coolant flows. Specifically, the CPU heat absorbing section 511 absorbs heat produced by a CPU 111, and the chipset heat absorbing sections 512 absorb heat produced by two chipsets 112, respectively. In the second cooling unit 510, the above three heat absorbing sections are connected to each other. Inside the connected body, provided are partition walls 513 forming, together with pipes to be described later, a passage indicated by arrows in FIG. 11 that guides the coolant to flow out of a heat radiating section 515 and back to the heat radiating section 515.

Moreover, the second cooling unit 510 also includes a fan 514 equivalent to the fan 134 illustrated in FIG. 5 and further includes the heat radiating section 515 having metal fins arranged in a blowing opening through which air from the fan 514 passes. Moreover, the heat radiating section 515 also includes a liquid passage through which the coolant flows, and the fins come into contact with the liquid passage. The air passing between the fins discharges heat of the coolant in the liquid passage.

The heat radiating section 515 is connected to the chipset heat absorbing section 512 through a first pipe 516 guiding the coolant from the heat radiating section 515 elsewhere. Moreover, the heat radiating section 515 is connected to the CPU heat absorbing section 511 through a second pipe 517 guiding the coolant to the heat radiating section 515.

Moreover, the second cooling unit 510 includes a pump 518 for circulating the coolant. Thus, in the second cooling unit 510, a circulating passage is formed, which allows the coolant to flow out of the heat radiating section 515, through the two chipset heat absorbing sections 512, the pump 518 and the CPU heat absorbing section 511 in this order, and then to come back to the heat radiating section 515.

Here, among the CPU 111 and the two chipsets 112, the CPU 111 is a maximum heat-producing element having a maximum heating value. In general, a conventional type of cooling unit, which transfers heat to a heat radiating section by circulating a coolant, often allows the coolant in a lowest temperature state, which has just left the heat radiating section, preferentially to flow to a maximum heat absorbing section which absorbs heat produced by the maximum heat-producing element such as the CPU. Meanwhile, from the viewpoint of heat resistance, many pumps used for circulating such a coolant have an upper limit set for a temperature of the coolant that flows therethrough. When the coolant preferentially flows to the maximum heat absorbing section as described above, the temperature of the coolant is likely to exceed the upper temperature limit in the pump. Thus, many conventional units require a complex passage, in which the coolant, after flowing out of the heat radiating section, goes to the maximum heat absorbing section thereby having the temperature increased, and then comes back to the heat radiating section again for radiating heat, and finally arrives at the pump.

In contrast, in the second cooling unit 510 illustrated in FIG. 11, the coolant that has just left the heat radiating section 515 preferentially flows to the chipset heat absorbing sections 512 absorbing the heat of the chipsets 112 having a heating value smaller than that of the CPU 111. In the second cooling unit 510, the chipset heat absorbing sections 512 serve as minimum heat absorbing sections having a heat absorption amount smaller than that of the CPU heat absorbing section 511 that is a maximum heat absorbing section. Moreover, in the second cooling unit 510, the coolant that has left the chipset heat absorbing sections 512 as the minimum heat absorbing sections is sent to the CPU heat absorbing section 511 as the maximum heat absorbing section through the pump 518.

In the development of the second cooling unit 510, the following has been confirmed. Specifically, an increase in the temperature of the coolant due to the heat produced by the chipsets 112 does not exceed the upper temperature limit in the pump 518. Furthermore, even the coolant having the temperature somewhat increased by the heat produced by the chipsets 112 sufficiently endures a transfer of heat produced by the CPU 111 and absorbed by the CPU heat absorbing section 511.

The second cooling unit 510 cools the CPU 111 and the chipsets 112 with a shortest passage, unlike a conventional complex passage, by circulating the coolant in the above order. Therefore, the second cooling unit 510 is efficiently placed in a limited space within the electronic device and thus cools the electronic device.

Meanwhile, in the second cooling unit 510, both of the two chipset heat absorbing sections 512 as the minimum heat absorbing sections are arranged on the upstream side of the pump 518. Although the pump 518 generates some heat, the above arrangement of the two chipset heat absorbing sections 512 in the second cooling unit 510 makes it possible to cool both of the two chipsets 112 while avoiding the influence of the heat produced by the pump 518. Thus, the second cooling unit 510 realizes further efficient cooling.

Moreover, in the second cooling unit 510, the heat of the coolant inside the heat radiating section 515 is radiated by the air from the fan 514. Thus, compared with, for example, heat radiation by natural convection, further efficient heat radiation is performed.

Note that, here, the description has been given of the structure in which all of the heat absorbing sections for the two chipsets are arranged on the upstream side of the pump in the flow of the coolant as an example of the cooling unit of the type which transfers the heat to the heat radiating section by circulating the coolant. However, the cooling unit of the type which transfers the heat to the heat radiating section by circulating the coolant is not limited thereto but at least one of the heat absorbing sections for the chipsets may be arranged on the upstream side of the pump.

Here, the second cooling unit 510 also includes a dust filter having a filter main body for removing dust from air flowing toward the heat radiating section 515 from the fan 514 and serving as a part of a duct wall for blowing air from the fan 514 onto the heat radiating section 515 without any leak.

Note that FIG. 11 illustrates a state where the dust filter is removed.

Figure 12:
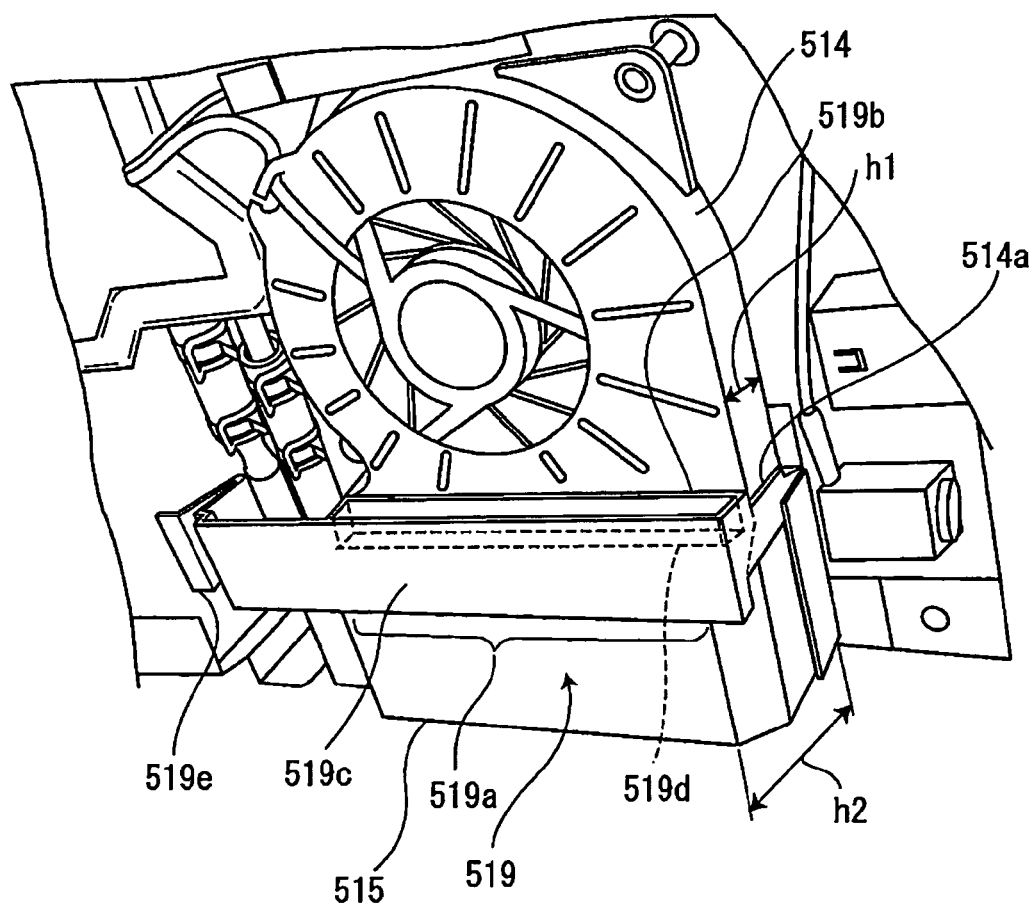
FIG. 12 illustrates a state where a dust filter is attached in the cooling unit illustrated in FIG. 11.

FIG. 12 illustrates a state where the dust filter is attached in the second cooling unit illustrated in FIG. 11.

As illustrated in FIG. 12, also in the second cooling unit 510, there is provided a dust filter 519 having a filter main body 519a inserted between a blowing opening 514a of the fan 514 and the heat radiating section 515.

Here, in the second cooling unit 510, a width of the blowing opening 514a (see FIG. 11) and a width of the heat radiating section 515 are approximately equal to each other. Moreover, positions, in a width direction, of the blowing opening 514a and the heat radiating section 515 approximately agree with each other.

Meanwhile, as illustrated in FIG. 12, there is a difference between a height h1 of the blowing opening 514a and a height h2 of the heat radiating section 515. Furthermore, positions of the blowing opening 514a and the heat radiating section 515 are shifted from each other in a height direction. Here, in the second cooling unit 510, the shape of the filter main body 519a of the dust filter 519 is designed as described below to deal with the differences in height and position.

In this embodiment, first, in the filter main body 519a of the dust filter 519, a shielding rib 519b for preventing the air coming out of the blowing opening 514a from leaking in the height direction is provided on the blowing opening 514a side having a relatively low height in the filter main body 519a of the dust filter 519.

Figure 13:
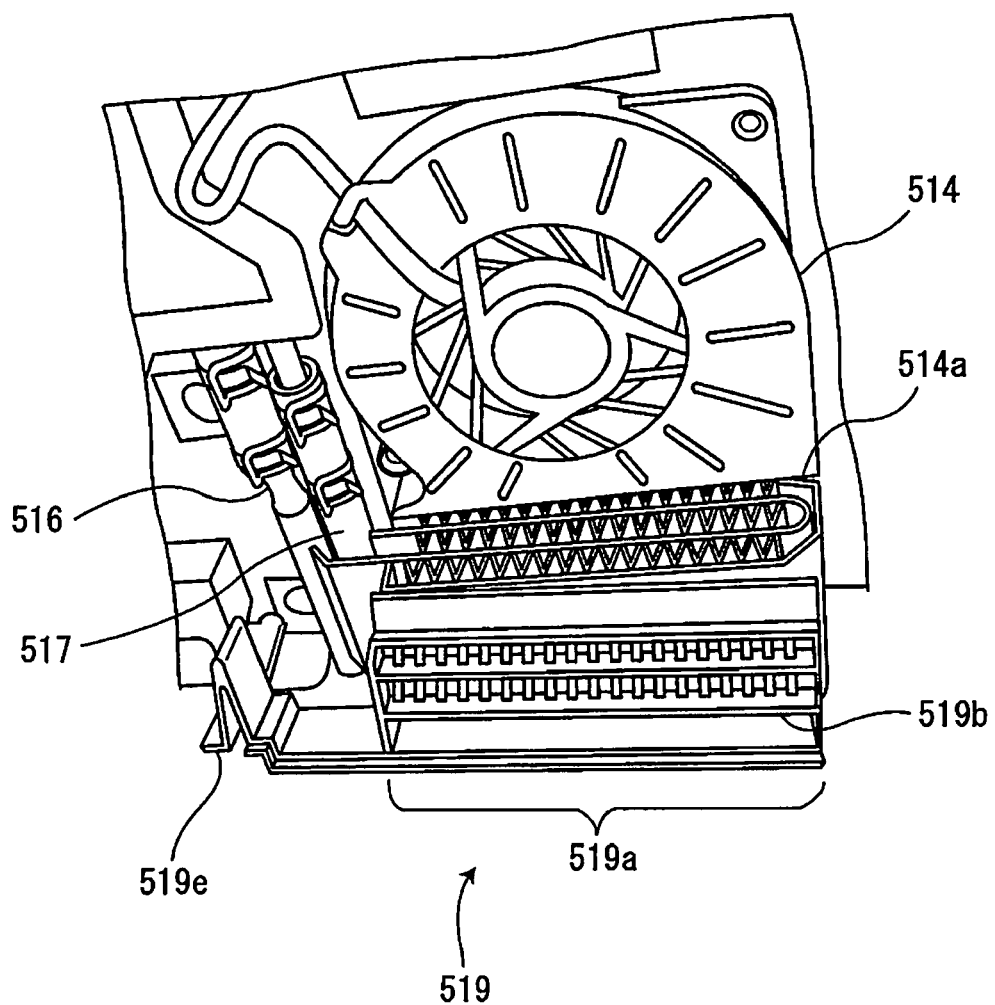
FIG. 13 illustrates a side of the dust filter illustrated in FIG. 12, which comes into contact with a blowing opening.

FIG. 13 illustrates a side of the dust filter illustrated in FIG. 12, which comes into contact with the blowing opening.

As illustrated in FIG. 13, the shielding rib 519b is a canopy-shaped rib protruding along an upper surface of the fan 514 toward the fan 514 from the side of the filter main body 519a coming into contact with the blowing opening 514a. This shielding rib 519b is provided at a position in the filter main body 519a, the position corresponding to the height h1 (see FIG. 12) of the blowing opening 514a.

Moreover, in this embodiment, as illustrated in FIG. 12, an upper surface 519c of the dust filter 519 is provided at a position corresponding to the relatively high height h2 of the heat radiating section 515. Furthermore, an edge of the upper surface 519c on the heat radiating section 515 side protrudes toward the heat radiating section 515 to be in a canopy shape along an upper surface of the heat radiating section 515.

Furthermore, as indicated by a dotted line in FIG. 12, a blocking plate 519d is provided to block a space between the shielding rib 519b and the upper surface 519c on the fan 514 side. Moreover, a passage of the air passing through the filter main body 519a extends from the fan 514 side toward the heat radiating section 515 as indicated by a dotted line in FIG. 12. Moreover, the shape of a lower surface opposed to the upper surface 519c in the dust filter 519 spreads toward a lower surface of the heat radiating section 515 from a lower surface of the blowing opening 514a. This structure allows formation of an air inlet and an air outlet in the dust filter 519, a size and a position of the air inlet corresponding to those of the blowing opening 514a of the fan 514 and a size and a position of the air outlet corresponding to those of a portion of the heat radiating section 515 onto which the air is blown. Thus, the air coming from the fan 514 heads toward the heat radiating section 515 without leaking.

Moreover, as in the case of the dust filter 131 illustrated in FIG. 4 and the like, the dust filter 519 also has a leaf spring 519e provided as illustrated in FIGS. 12 and 13, the leaf spring being intended to fix the dust filter 519 with a pressing operation of the filter main body 519a against the housing.

In order to effectively press the filter main body 519a against the housing, the leaf spring 519e is preferably disposed as close to the filter main body 519a as possible.

Incidentally, in the second cooling unit 510 illustrated in FIGS. 11 to 13, the first and second pipes 516 and 517 are connected to the heat radiating section 515. These pipes are arranged just proximal to the heat radiating section 515 along the flow of the air. Thus, if the leaf spring 519e of the dust filter 519 is disposed near the filter main body 519a as described above, the leaf spring 519e interferes with the first and second pipes 516 and 517. On the other hand, when the pipes are detoured and arranged to dispose the leaf spring 519e at the desirable position, the circulation route of the coolant devised as described with reference to FIG. 11 has to be extended. Such a detour lowers cooling efficiency of the second cooling unit 510.

Therefore, the second cooling unit 510 is configured so that, in attachment of the dust filter 519, the leaf spring 519e of the dust filter 519 is disposed at a position across the first and second pipes 516 and 517 arranged just proximal to the heat radiating section 515.

Figure 14:
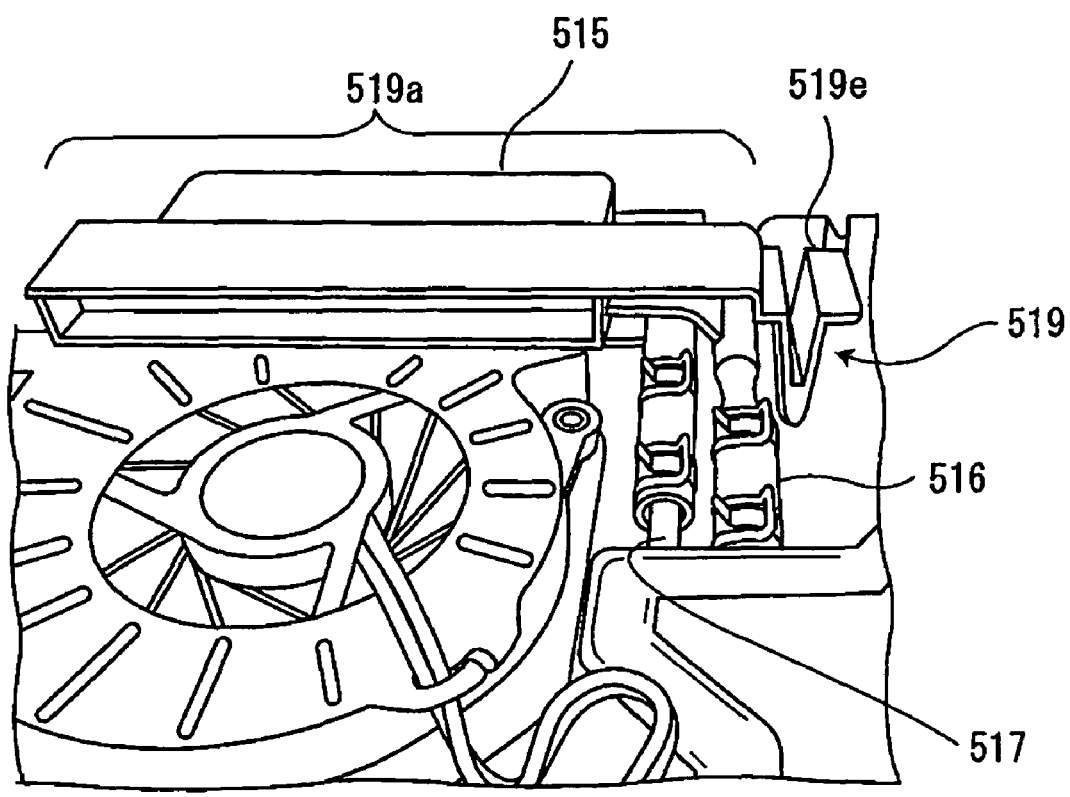
FIG. 14 illustrates a state where a leaf spring of the dust filter is disposed at a position across the first and second pipes.

FIG. 14 illustrates a state where the leaf spring of the dust filter is disposed at a position across the first and second pipes.

As illustrated in FIG. 14, in the second cooling unit 510, the leaf spring 519e of the dust filter 519 is disposed at a position slightly distant from the filter main body 519a. Thus, in attachment of the dust filter 519, the leaf spring 519e is disposed at a position across the first and second pipes 516 and 517 arranged just proximal to the heat radiating section 515. In the second cooling unit 510, such arrangement of the leaf spring 519e enables the first and second pipes 516 and 517 to be arranged just proximal to the heat radiating section 515, thereby preventing a decrease in cooling efficiency.

Note that the description has been given of the dust filter 519 of a type having the leaf spring disposed to avoid the pipes passing near the heat radiating section as an example of the dust filter including the filter main body and the leaf spring. However, the dust filter having the leaf spring disposed to avoid the components near the heat radiating section is not limited to this example. For instance, the dust filter may be a type having the leaf spring disposed to avoid electronic components and the like near the heat radiating section.

This concludes the description of the another embodiment including the second cooling unit 510 with reference to FIGS. 11 to 14. Referring back to FIG. 5 again, an internal structure of the main unit 20 of the personal computer 10 illustrated in FIG. 5 will be described.

In the main unit 20, various input signals generated using the keyboard 22, the track pad 23 and the right and left click buttons 24 and 25 illustrated in FIG. 2 by the user operating the respective parts are sent to the main board 110. In this embodiment, three flat cables 140 are used to transmit the various input signals to the main board 110. The three flat cables 140 each have one end connected to a connector mounted on a back side of the main board 110 through a path which is partially along an inner wall of the main-unit housing 21, the back side of the main board 110 being opposed to the side having the CPU 111 and the cooling unit 130 mounted thereon.

Figure 15:
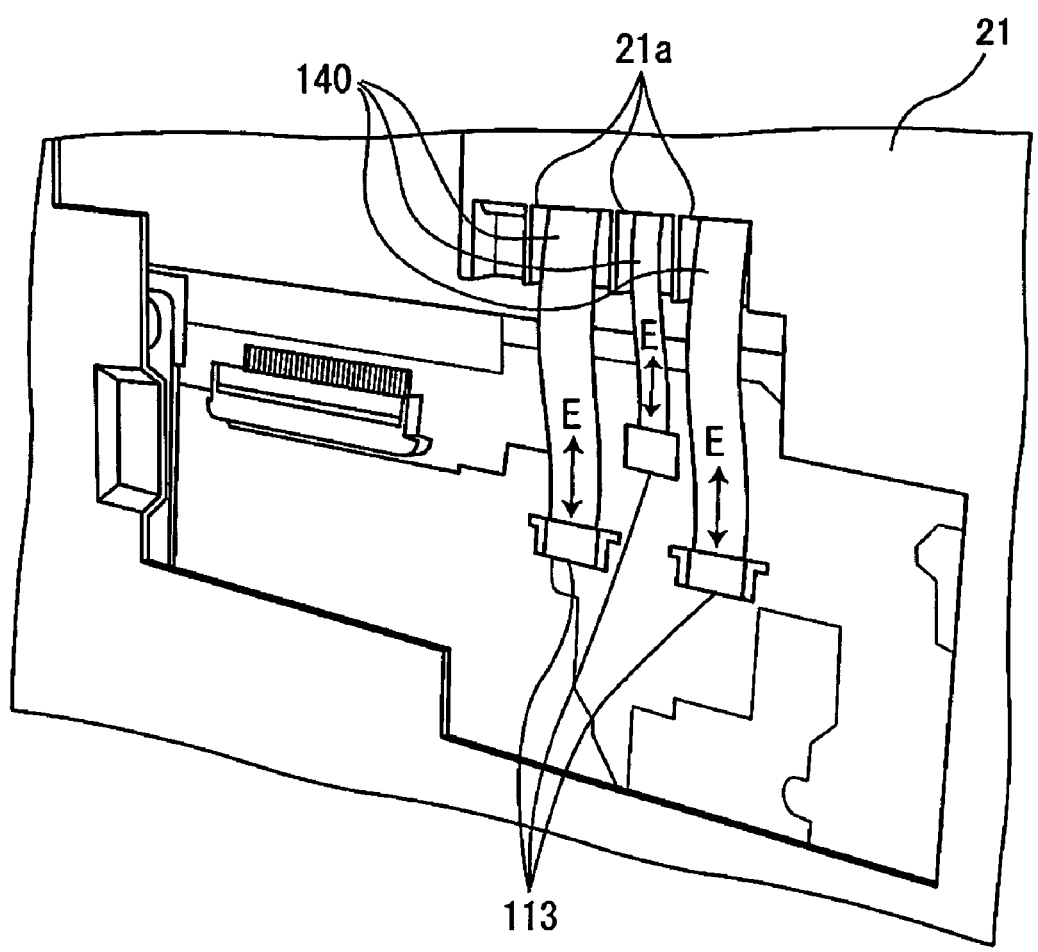
FIG. 15 illustrates a state where three flat cables illustrated in FIG. 5 are connected to connectors mounted on the back side of the main board.

FIG. 15 illustrates a state where the three flat cables illustrated in FIG. 5 are connected to the connectors mounted on the back side of the main board.

FIG. 15 illustrates an enlarged view of a portion where the back side of the main board 110 is exposed from the main-unit housing 21 in a state where the keyboard 22 is detached from the main unit 20 illustrated in FIG. 2.

As illustrated in FIG. 15, on the back side of the main board 110, three flat cable connectors 113 are mounted so as to correspond to the three flat cables 140, respectively. The flat cables 140 are connected to the flat cable connectors 113, respectively.

Here, in order to connect the flat cables 140 to the flat cable connectors 113, respectively, in assembly of the main unit 20, leading ends of the flat cables 140 have to be moved in a direction of connection to the flat cable connectors 113 indicated by arrows E in FIG. 15, in other words, in longitudinal directions of the flat cables 140.

Conventionally, above operations are often performed by positioning the flat cables by temporarily fixing the flat cables to the housing or the like with tapes and then connecting the flat cables to the connectors by moving the leading ends of the flat cables in the longitudinal directions. Such a method requires some margins in length between the temporary fixing positions and the leading ends for allowing an operator to perform the operation by moving the leading ends. As a result, the lengths of the connected flat cables turn out to be redundant. Accordingly, there arises a problem that such redundancies hinder the assembly operation of the electronic device after connection of the flat cables and thus workability is lowered.

Therefore, in this embodiment, flat cable holding sections 21a for holding the flat cables 140 while allowing the flat cables 140 to be movable in the longitudinal directions are provided on the paths before reaching the flat cable connectors 113, respectively.

Figure 16:
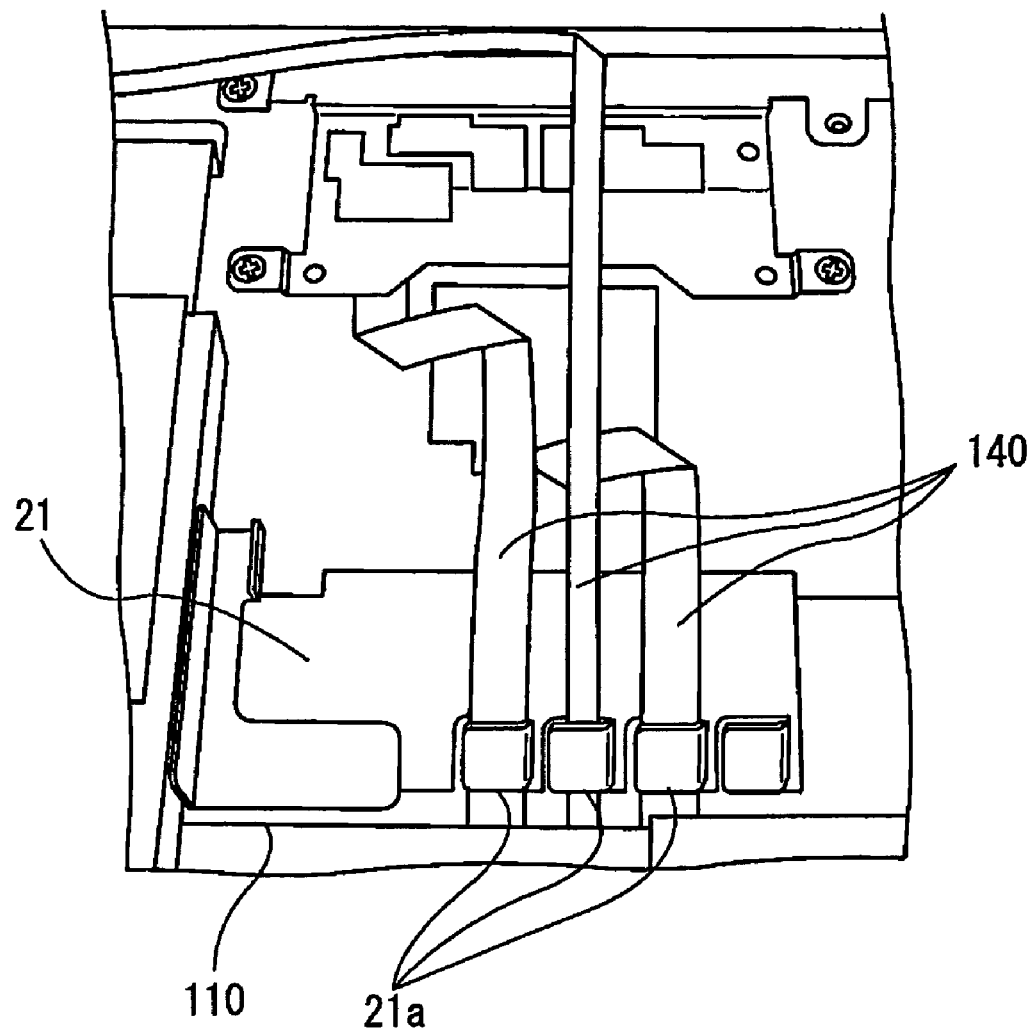
FIG. 16 illustrates cable holding sections from the front side of the main board illustrated in FIG. 5.
Figure 17:
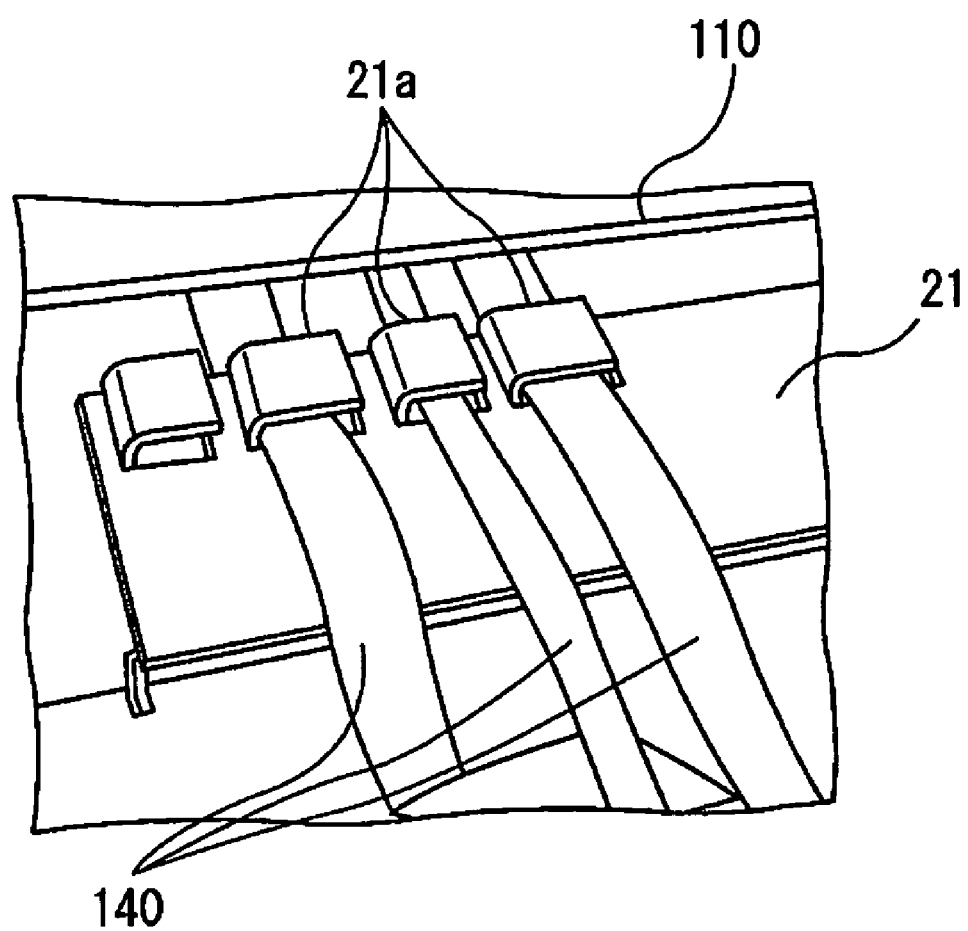
FIG. 17 illustrates the cable holding sections from a direction different from FIG. 16 on the front side of the main board illustrated in FIG. 5.

FIG. 16 illustrates the cable holding sections from the front side of the main board illustrated in FIG. 5. FIG. 17 illustrates the cable holding sections from a direction different from FIG. 16 on the front side of the main board illustrated in FIG. 5.

The flat cable holding sections 21a are provided for the flat cables 140 respectively. The flat cable holding section 21a has a band-shaped structure, which protrudes higher than a thickness of the flat cable 140 from the inner wall of the main-unit housing 21, is bent in a direction along the inner wall, and extends longer than a width of the flat cable 140 along the inner wall.

Each of the flat cables 140 extends toward the main board 110 from the front side of the main board 110 and reaches the back side of the main board 110 by passing under the extended portion of each of the flat cable holding sections 21a. In this way, the flat cable 140 is connected to each of the flat cable connectors 113 as illustrated in FIG. 15.

Such a structure enables the flat cables 140 to be held by the flat cable holding sections 21a while being movable in the longitudinal directions when the flat cables 140 are to be connected to the flat cable connectors 113. Thus, margins for moving the leading ends as in the conventional case are not particularly required to be prepared. Accordingly, the flat cables 140 is shortened and thus the workability is improved.

Moreover, in this embodiment, the main board 110 is attached to the inner wall of the main-unit housing 21. The flat cables 140 are connected to the flat cable connectors 113 mounted on the back side of the main board 110, that is, the inner wall side of the main board 110. With this structure, in the processing of connecting the flat cables 140, the main-unit housing 21, which is in a state of having the main board 110 attached thereto and having the flat cables 140 laid to some extent, needs to be turned over at least once. In this embodiment, during turning over the main-unit housing 21, the flat cables 140 are held by the above flat cable holding sections 21a. Thus, the main-unit housing 21 may be turned over while maintaining the positions of the arranged flat cables 140. In this regard as well, the workability is improved.

Moreover, as described above, in this embodiment, each of the flat cable holding sections 21a is provided for each of the flat cables 140. Thus, the positions of the flat cables 140 are surely maintained for each of the flat cables 140 as described above.

Note that the description has been given here of the flat cable holding sections 21a holding the flat cables as an example of the cable holding sections for holding the cables so that the cables are movable along the arrangement paths as described above. However, such cable holding sections are not limited to the use in holding the flat cables but also may be applied to hold general cables.

This concludes the description of the flat cables 140 with reference to FIGS. 15 to 17. Referring back to FIG. 5 again, description of the internal structure of the main unit 20 of the personal computer 10 of this embodiment will be continued.

As described above, the main unit 20 has the main board 110 and the sub-board 120 housed therein, the sub-board being connected to the main board 110 through a connector and including an antenna module to be described later and the like mounted thereon.

Here, in this embodiment, the sub-board 120 is fixed to the main board 110 and the main-unit housing 21 with screws.

Thus, through-holes through which the screws for fixing those described above penetrate are provided in the sub-board 120.

Figure 18:
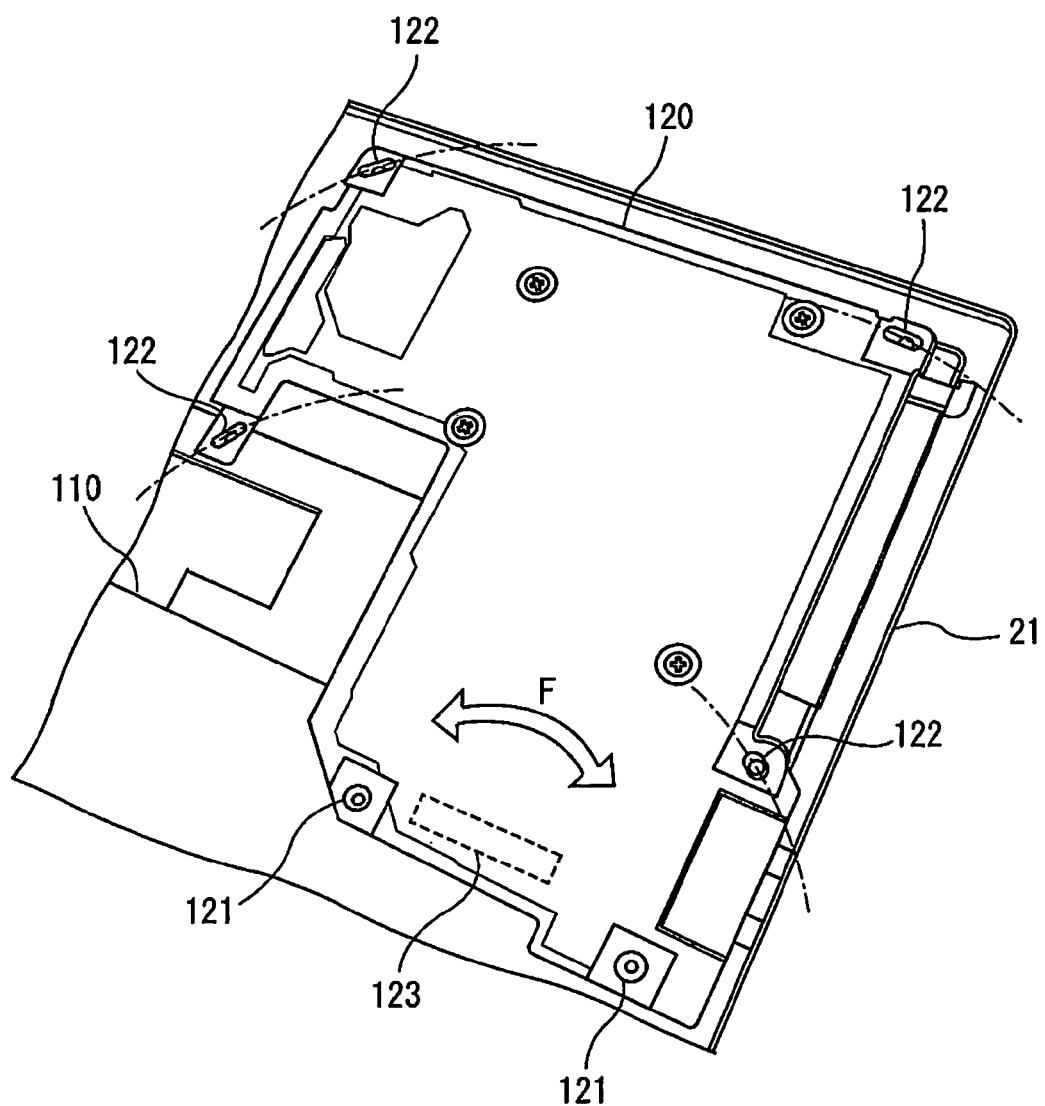
FIG. 18 is an enlarged view of a sub-board illustrated in FIG. 5.

FIG. 18 is an enlarged view of the sub-board illustrated in FIG. 5.

As illustrated in FIG. 18, in the sub-board 120, provided are: two through-holes (main board through-holes) 121 for screwing the sub-board 120 to the main board 110; and four through-holes (housing through-holes) 122 for screwing the sub-board 120 to the main-unit housing 21.

Moreover, in this embodiment, the two main board through-holes 121 are circular holes and the four housing through-holes 122 are elongate holes.

This is because the sub-board 120 and the main board 110 are connected to each other through connectors as described below.

Figure 19:
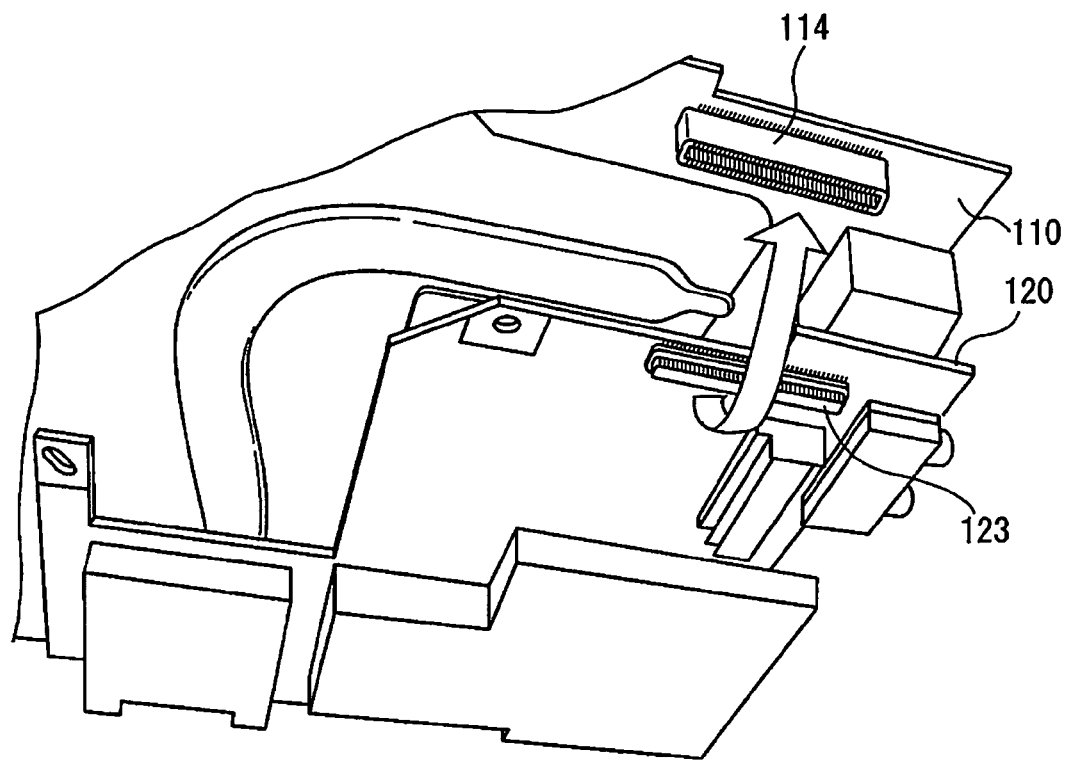
FIG. 19 illustrates a state where the sub-board detached from the main board is turned over and connectors of the respective boards is seen.
Figure 20:
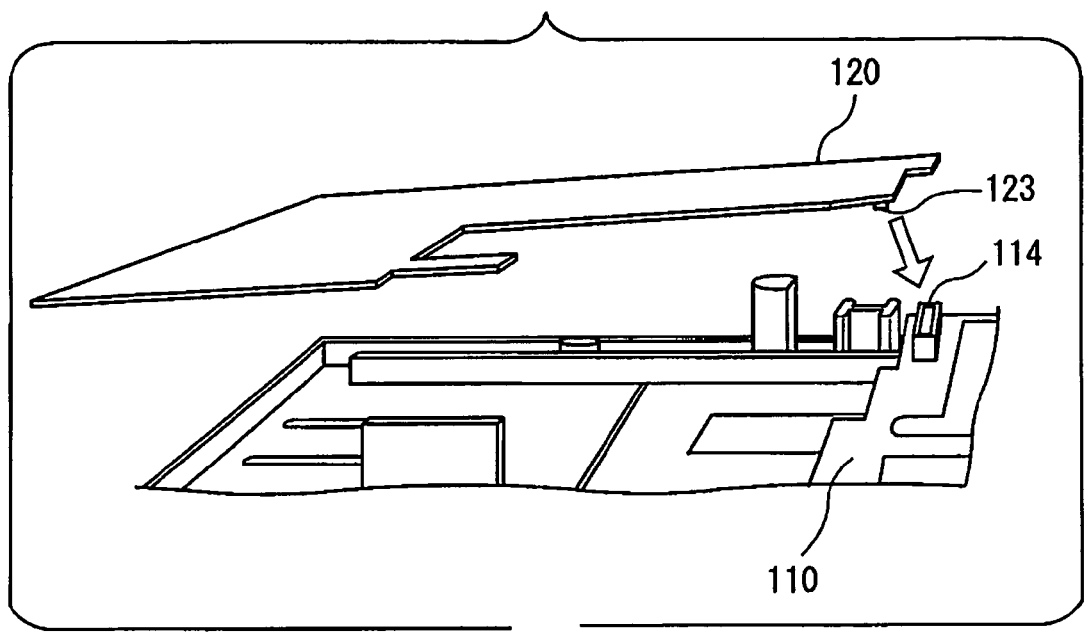
FIG. 20 is a side view illustrating how the sub-board connector and the main board connector are connected to each other.

FIG. 19 illustrates a state where the sub-board detached from the main board is turned over and the connectors of the respective boards is seen. FIG. 20 is a side view illustrating how the sub-board connector and the main board connector are connected to each other.

Note that FIGS. 19 and 20 illustrate a state where the antenna module to be described later is detached from the sub-board.

As illustrated in FIG. 19, the sub-board 120 includes a rectangular male connector 123 for connection to the main board 110 on a back side opposed to the side illustrated in FIG. 18. Meanwhile, the main board 110 includes on its front side a rectangular female connector 114 to be engaged with the male connector 123. These two board connectors are connected to each other as illustrated in FIG. 20 in assembly of the main unit 20.

Here, the male connector 123 is attached to the sub-board 120, and the female connector 114 is attached to the main board 110 by soldering the connectors to the boards, respectively. Thus, a position on the sub-board 120 to which the male connector 123 is attached, and a position on the main board 110 to which the female connector 114 is attached may be erroneously shifted in a rotational direction from their respective attachment positions in design.

When there are such shifts in the rotational direction in the attachment positions of the male connector 123 and the female connector 114, the sub-board 120 is shifted in a circumferential direction indicated by an arrow F around the male connector 123 as illustrated in FIG. 18. As a result, between each of the six through-holes provided in the sub-board 120 and each of screw holes corresponding thereto, there occur positional shifts around the male connector 123 in a direction corresponding to the circumference according to a distance from the center. Among the six through-holes, the two main board through-holes 121 are provided near the male connector 123, and thus, such positional shifts are small. However, the four housing through-holes 122 provided at positions distant from the male connector 123 may have large positional shifts.

Therefore, in this embodiment, in order to cope with such positional shifts, the four housing through-holes 122 are formed to be the elongate holes extending in the direction of a tangent to the circumference passing through the screw attachment positions around the male connector 123. Thus, even if there are such shifts of the attachment positions of the male connector 123 and the female connector 114, the sub-board 120 is easily screwed to the main-unit housing 21.

Note that, in consideration of a manufacturing workability, this embodiment provides the description in which the direction of the tangent to the circumference passing through the screw attachment positions is used as an example of a direction having a predetermined relationship with the circumference. Moreover, the housing through-holes 122 are formed as elongate holes linearly extended in the direction of the tangent to the circumference passing through the screw attachment positions. However, the direction having the predetermined relationship with the circumference passing through the screw attachment positions may be a direction along the circumference. Moreover, the housing through-holes 122 may be circular elongate holes along the circumference.

Moreover, here, the screws have been described as an example of fastening members for fixing the sub-board 120 to the main board 110 and the main-unit housing 21 as described above. However, the fastening members are not limited to the screws but may be other kinds of fastening members such as press-fit pins.

This concludes the description of screwing the sub-board 120 with reference to FIGS. 18 to 20. Referring back to FIG. 5 again, description of the internal structure of the main unit 20 of the personal computer 10 of this embodiment will be continued.

In this embodiment, the main unit 20 includes a TV signal connector 150 capable of receiving a TV antenna signal. Moreover, a TV signal cable 160 extending from the TV signal connector 150 to transmit the TV antenna signal is connected to the antenna module to be described later which is mounted on the back side of the sub-board 120.

Figure 21:
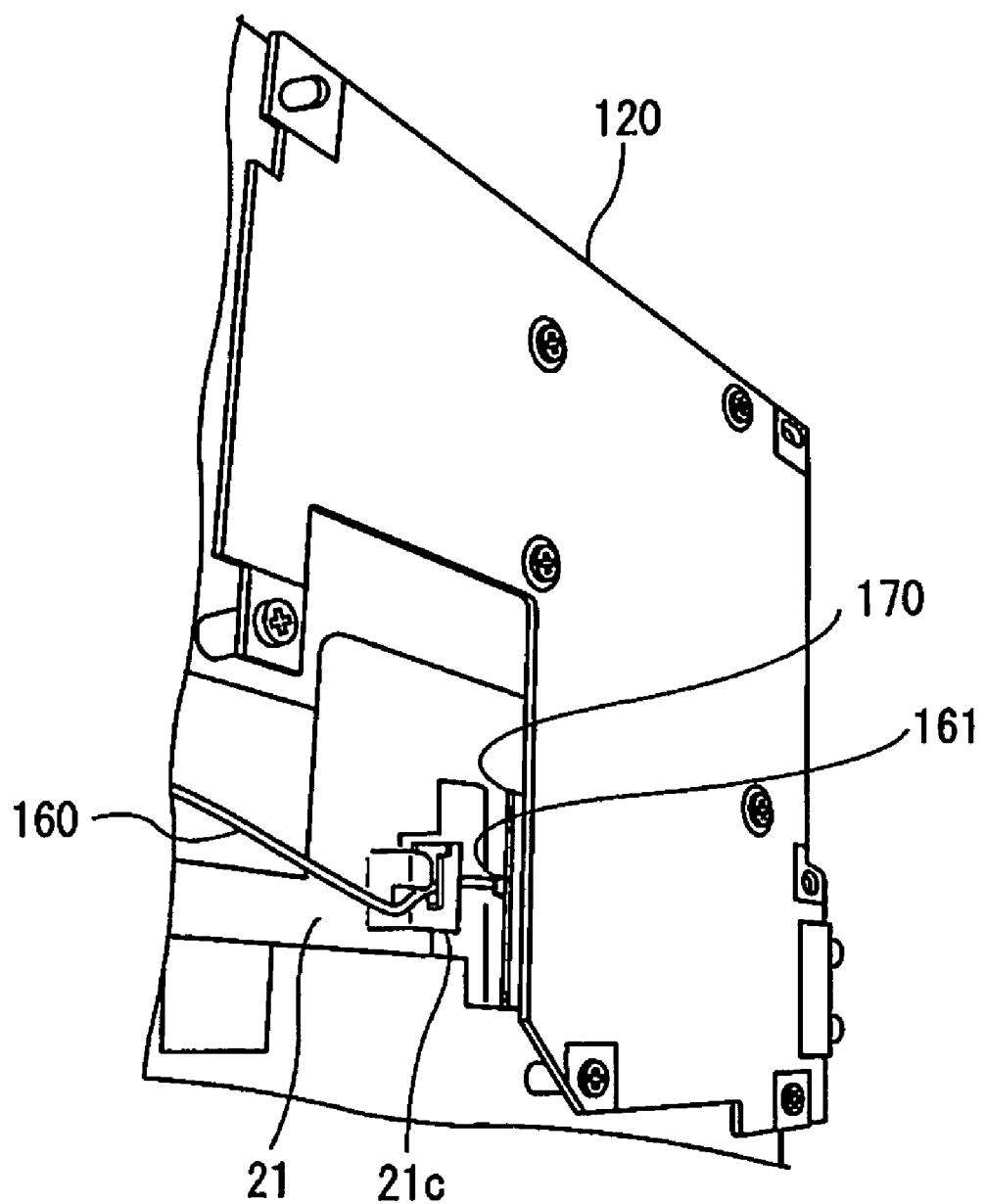
FIG. 21 illustrates a state where a TV signal cable illustrated in FIG. 5 is connected to an antenna module mounted on the back side of the sub-board.
Figure 22:
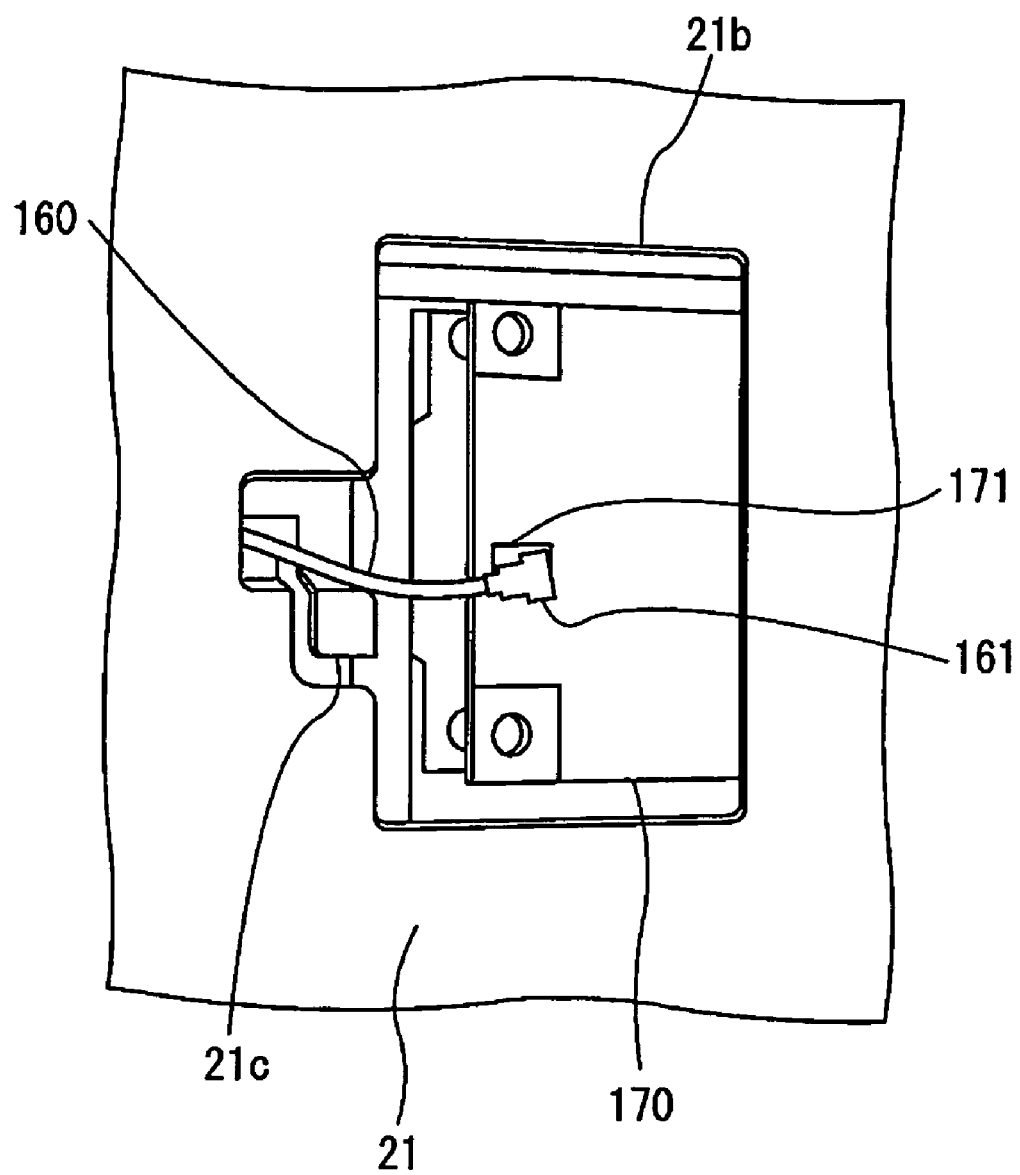
FIG. 22 illustrates the antenna module having the TV signal cable connected thereto.

FIG. 21 illustrates a state where the TV signal cable illustrated in FIG. 5 is connected to the antenna module mounted on the back side of the sub-board. FIG. 22 illustrates the antenna module having the TV signal cable connected thereto.

An antenna module 170 is a board for converting the TV antenna signal into a signal that may be handled within the personal computer 10 by performing signal processing compliant with predetermined communication standards, the TV antenna signal received by the TV signal connector 150 and transmitted through the TV signal cable 160. This antenna module 170 is mounted on the back side of the sub-board 120. Moreover, on the antenna module 170, a connector (input connector) 171 for inputting a TV signal to the antenna module 170 is mounted. Furthermore, the TV signal cable 160 includes a TV signal output connector 161 at its leading end on the antenna module 170 side, the TV signal output connector 161 being connected to the TV signal input connector 171.

Here, FIG. 22 illustrates an enlarged view of a portion where the antenna module 170 is exposed from the main-unit housing 21 in a state where the keyboard 22 is detached from the main unit 20 illustrated in FIG. 2. As illustrated in FIG. 22, the main-unit housing 21 includes an operation opening 21*b* for the operator to access the TV signal input connector 171 of the antenna module 170 in assembly of the main unit 20. The TV signal output connector 161 of the TV signal cable 160 is connected to the TV signal input connector 171 of the antenna module 170 with an operation through the operation opening 21*b* in the main-unit housing 21.

Here, generally, the above TV signal connector is often attached to the back side of the main unit of the personal computer as in the case of this embodiment illustrated in FIG. 5. On the other hand, the antenna module may be disposed at a position near the front side opposed to the back side, as in the case of this embodiment illustrated in FIG. 5, as a matter of arrangement convenience inside the main unit. In this case, the output connector of the TV signal cable is connected to the input connector of the antenna module in the following manner. First, as illustrated in FIG. 5, the lower surface of the main unit is turned up and the TV signal cable is arranged so as to allow the output connector to come close to the antenna module. Thereafter, the main unit is turned over and the output connector is connected to the input connector with an operation through the operation opening for the access to the antenna module on the upper surface of the main unit. Conventionally, during such an operation, operational inefficiency often occurs in that the TV signal cable has to be rearranged, since the output connector of the TV signal cable retracts into the housing when the main unit is turned over.

To avoid such operational inefficiency, in the main unit 20 of this embodiment, the TV signal output connector 161 may be temporarily held when the TV signal cable 160 is arranged as described above. For this purpose, a TV signal cable holding section 21c is provided on the lower surface illustrated in FIGS. 5 and 21 in the main-unit housing 21. Specifically, the TV signal cable holding section 21c holds the TV signal cable 160 so as to allow a part (that is an end or a middle part) of the TV signal cable 160 to reach the operation opening 21b.

Figure 23:
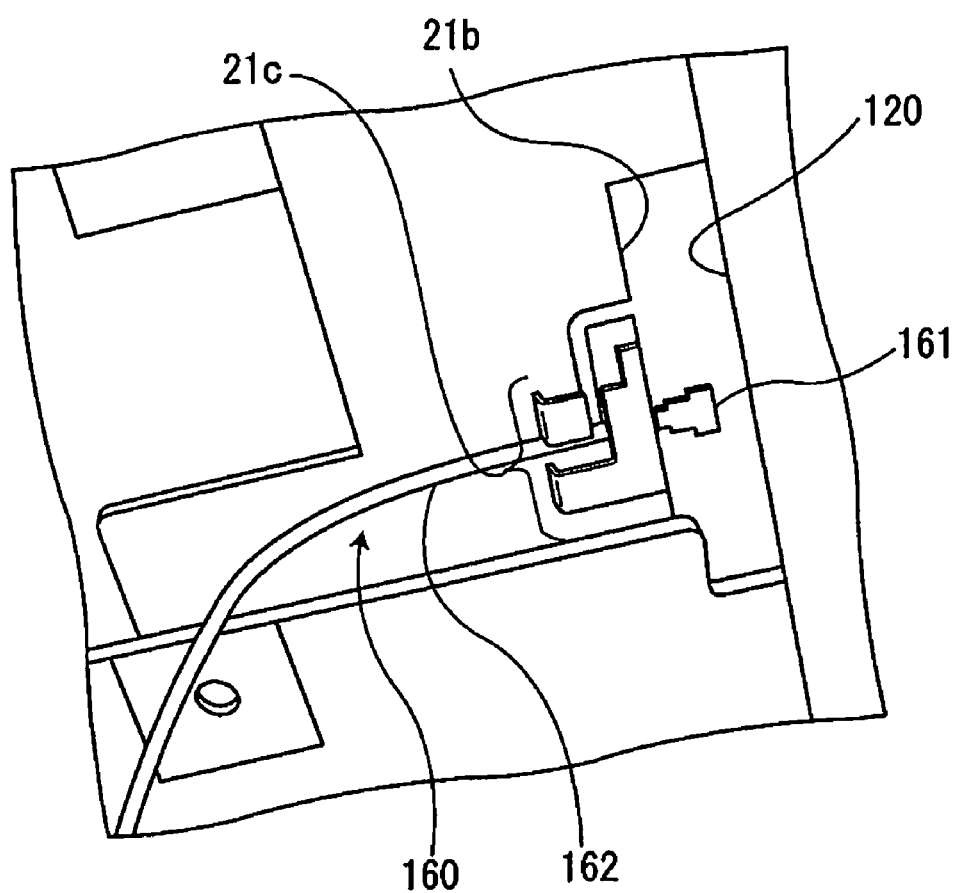
FIG. 23 is an enlarged view illustrating a cable holding section together with an output connector temporarily held by the cable holding section.

FIG. 23 is an enlarged view illustrating the cable holding section together with the output connector temporarily held by the cable holding section.

The TV signal cable holding section 21c has a slit formed therein, the slit having a width smaller than the size of the TV signal output connector 161. Once the TV signal cable 160 is arranged as described above, a cable main body 162 is inserted into the slit as illustrated in FIG. 23. As mentioned above, the slit in the TV signal cable holding section 21c has the width smaller than the size of the TV signal output connector 161. Therefore, even when the main unit 20 is turned over to connect the TV signal output connector 161 to the TV signal input connector 171 of the antenna module 170, the TV signal output connector 161 remains being held by the TV signal cable holding section 21c. Accordingly, it is possible to avoid such an operational inefficiency that the TV signal output connector 161 retracts into the main-unit housing 21 during the operation. In this embodiment, the workability is improved by such an action of the TV signal cable holding section 21c.

Moreover, in this embodiment, the antenna module 170 has the TV signal input connector 171 on the side facing the operation opening 21b. Thus, the connectors are allowed to be connected through the operation opening 21b. In this regard as well, the workability is improved.

Moreover, in this embodiment, the TV signal cable holding section 21c is provided on the arrangement path of the TV signal cable 160 and on the edge of the operation opening 21b. Thus, the operation of connecting the connectors through the operation opening 21b is facilitated. Thus, the workability is further improved.

Note that, here, the description has been given of the TV signal cable 160 and the antenna module as examples of the cable and the board, which are connected to each other by engaging the connectors thereof with each other. However, the cable and the board are not limited thereto and a radio communication cable and a radio module, for example, may be used.

This concludes the description of the internal structure of the main unit 20 with reference to FIGS. 5 to 23. Next, the display unit 30 illustrated in FIG. 2 will be described.

Figure 24:
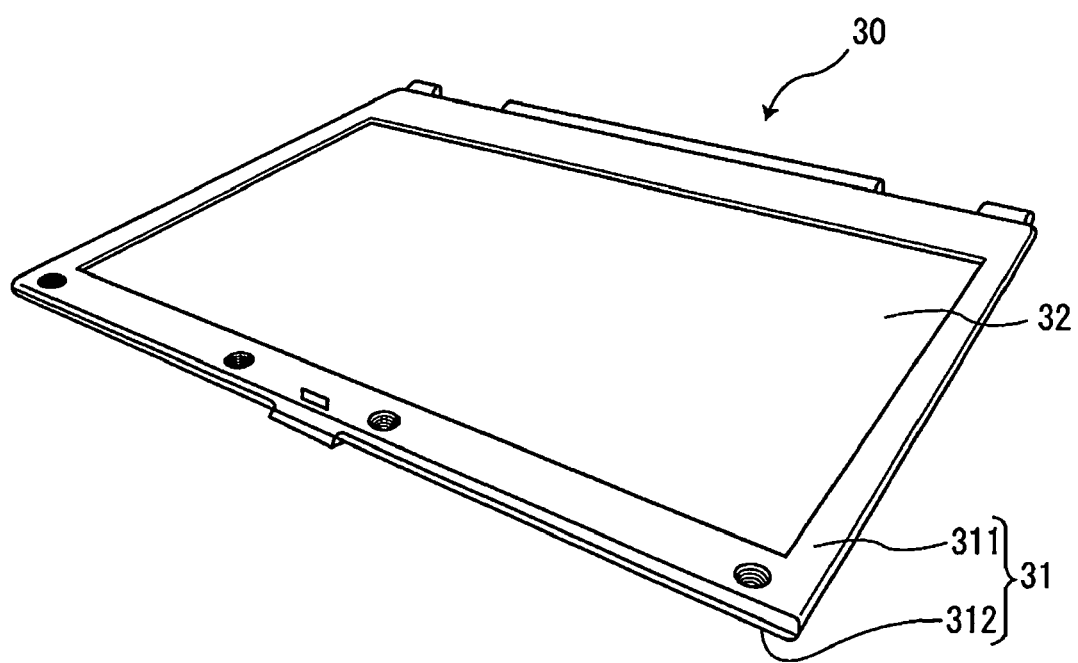
FIG. 24 illustrates the display unit illustrated in FIG. 2 in a state of being detached from the main unit.

FIG. 24 illustrates the display unit illustrated in FIG. 2 in a state of being detached from the main unit.

As described above, the display unit 30 has the flat liquid crystal panel 32, the control circuit for the liquid crystal panel and the like housed in the display housing 31. Moreover, the display housing 31 includes an upper panel 311 and a lower panel 312. The upper panel 311 is a housing wall forming a frame of an opening through which a display screen of the liquid crystal panel 32 is exposed. The lower panel 312 is a housing wall facing the upper panel 311 with an internal space therebetween. In the internal space, the liquid crystal panel 32 and the like are housed. Electronic components to be housed in the display unit 30, such as the liquid crystal panel 32, are fixed to the lower panel 312.

Figure 25:
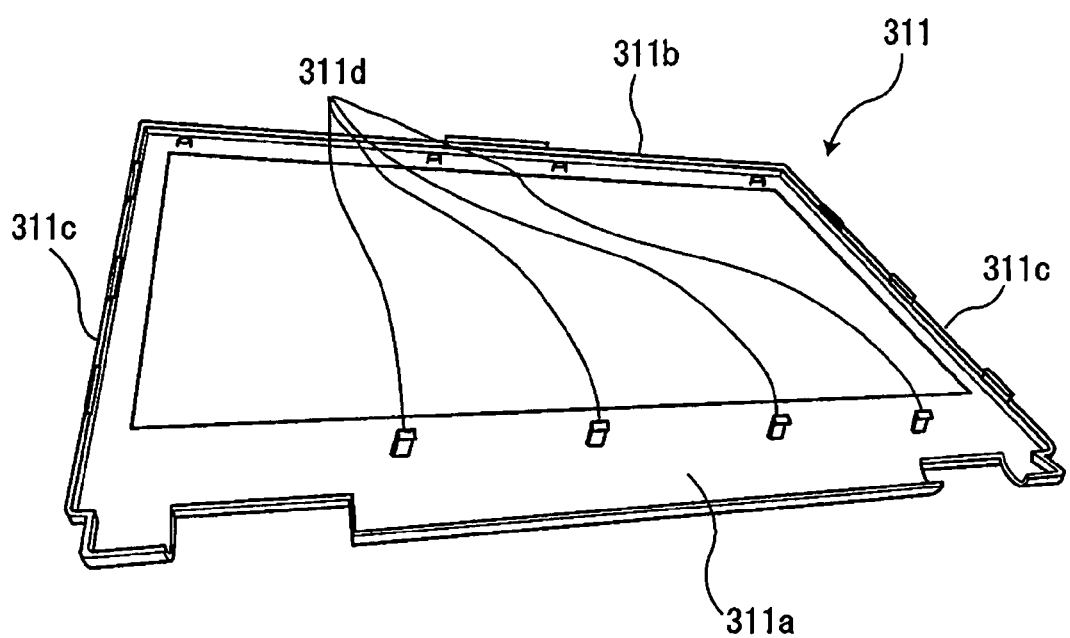
FIG. 25 illustrates an upper panel removed from the display unit.
Figure 26:
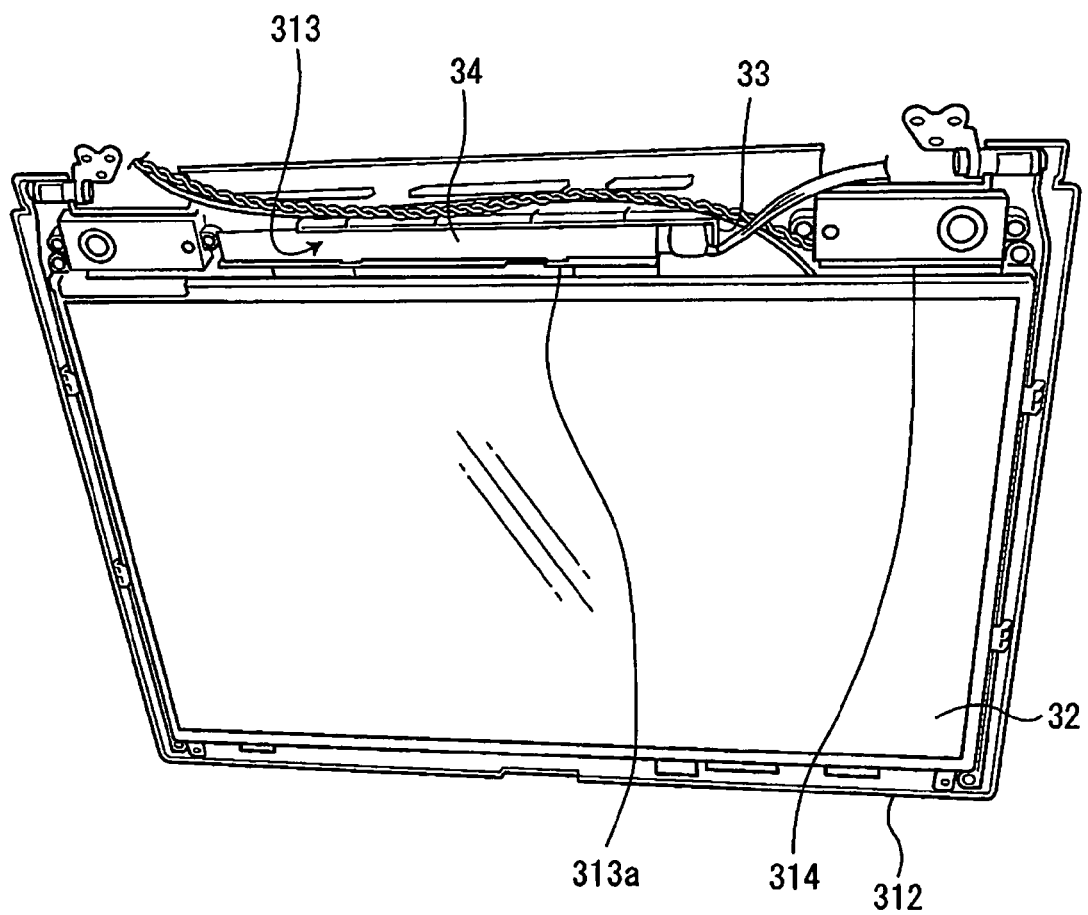
FIG. 26 illustrates the display unit having the upper panel removed therefrom.

FIG. 25 illustrates the upper panel removed from the display unit. FIG. 26 illustrates the display unit having the upper panel removed therefrom.

FIG. 25 illustrates the upper panel 311 in a reversed state. Moreover, FIG. 25 illustrates a connection side of the main unit 20 and the display unit 30 positioned frontward.

FIG. 26 illustrates the liquid crystal panel 32 fixed to the lower panel 312, an inverter circuit board 33 for turning on a backlight of the liquid crystal panel 32, and the like. Moreover, in the lower panel 312, a concave section 313 for housing the inverter circuit board 33 is provided, the concave section 313 being formed of ribs surrounding its periphery. The inverter circuit board 33 is housed in the concave section 313 in a state of being covered with a retaining sheet 34 for retaining the inverter circuit board 33 in the concave section 313. Specifically, the retaining sheet 34 is formed of a PET film and details thereof will be described later.

In this embodiment, the upper panel 311 is fixed to the lower panel 312 by use of screws or by locking with locking claws provided on an outer edge of the upper panel 311.

Here, a lower frame part 311a of the upper panel 311 on the connection side is wider than an upper frame part 311b opposed to the connection side or two side frame parts 311c. Thus, in the lower frame part 311a, a space is easily formed between the liquid crystal panel 32 and an inner edge of the lower frame part 311a.

Therefore, in this embodiment, four locking claws 311d for preventing the lower frame part 311a and the lower panel 312 from separating from each other by fixing the inner edge of the lower frame part 311a to the lower panel 312 are arranged near the inner edge so as to align along the edge of the liquid crystal panel 32 in a state where the upper panel 311 is assembled to the lower panel 312. The four locking claws 311d are protrusions protruding toward the lower panel 312 from the lower frame part 311a. The locking claws 311d catch on a rib (liquid crystal side rib) 313a on the liquid crystal panel 32 side among the ribs forming the concave section 313 illustrated in FIG. 26 and a short rib 314 arranged to the right, in FIG. 26, of the liquid crystal side rib 313a with a wiring space left therebetween.

Figure 27:
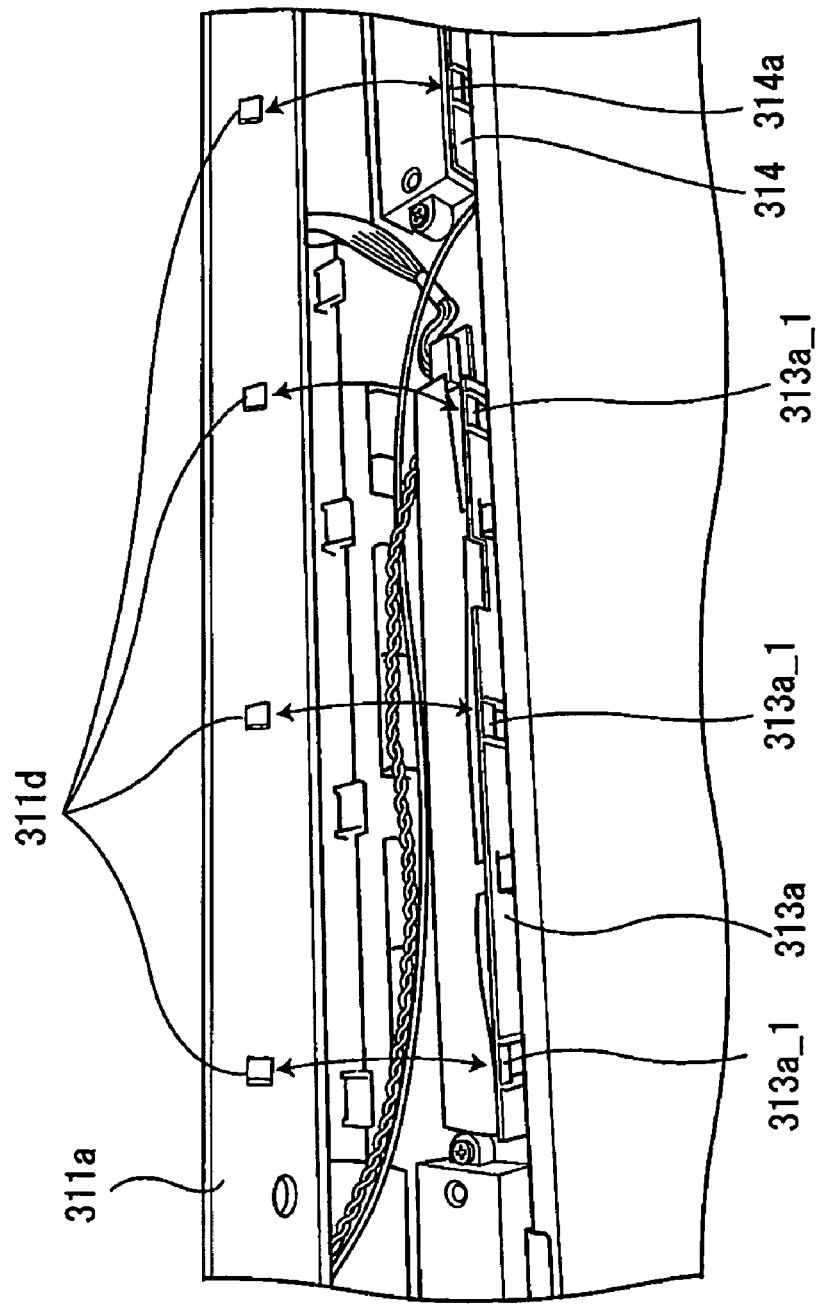
FIG. 27 illustrates a state where locking claws arranged on a lower frame part, a liquid crystal side rib and a short rib are lined up.

FIG. 27 illustrates a state where the locking claws 311d arranged on the lower frame part, the liquid crystal side rib 313a and the short rib 314 are lined up.

As illustrated in FIG. 27, the liquid crystal side rib 313a has three locking holes 313a_1 provided therein and the short rib 314 has one locking hole 314a provided therein. Among the four locking claws 311d, the three locking claws 311d on the left side in FIG. 27 catch on the three locking holes 313a_1 in the liquid crystal side rib 313a, respectively. Moreover, among the four locking claws 311d, the one locking claws 311d on the right side in FIG. 27 catches on the locking hole 314a in the short rib 314.

When the four locking claws 311d catch on the three locking holes 313a_1 in the liquid crystal side rib 313a and the one locking hole 314a in the short rib 314, respectively, the inner edge of the lower frame part 311a is fixed to the lower panel 312. Thus, the liquid crystal panel 32 and the inner edge of the lower frame part 311a are prevented from being spaced apart from each other.

Moreover, since the lower frame part 311a is wide as described above, the lower frame part 311a is easily bent when pressed by the user or the like.

Therefore, in this embodiment, the liquid crystal side rib 313a and the short rib 314 are formed so as to have their upper edges come into contact with the lower frame part 311a of the upper panel 311 in a state where the upper panel 311 is attached to the lower panel 312. Thus, the liquid crystal side rib 313a and the short rib 314 react to the pressure applied to the lower frame part 311a, thereby preventing the lower frame part 311a from bending.

Here, in this embodiment, as described above, in the state where the upper panel 311 is attached to the lower panel 312, the locking claws 311d, for preventing the liquid crystal panel 32 and the inner edge of the lower frame part 311a from being spaced apart from each other, and the ribs 313a and 314 for preventing the lower frame part 311a from bending are integrated with each other. Thus, in this embodiment, the spacing and bending are efficiently prevented within a limited space.

Note that, here, the description has been given of the structure in which the four locking claws 311d are provided as protrusions protruding toward the lower panel 312 from the upper panel 311 and the two types of ribs, the liquid crystal side rib 313a and the short rib 314, are provided as the protrusions protruding toward the upper panel 311 from the lower panel 312. However, the numbers of claws and ribs are not limited thereto. Alternatively, the number of the claws and that of the ribs may be different from each other or different from the example described above, or a single claw and a single rib may be provided. Furthermore, only the number of either the claws or the ribs may be more than one.

Moreover, here, the description has been given of the display housing 21 having the opening provided therein, through which the display screen of the liquid crystal panel 32 is exposed. However, spacing and bending prevention by the locking claws and the ribs may be also applied to prevention of spacing and bending between simple housing walls having no such opening provided therein.

Next, a structure of housing the inverter circuit board 33 in the lower panel 312 will be described.

Figure 28:
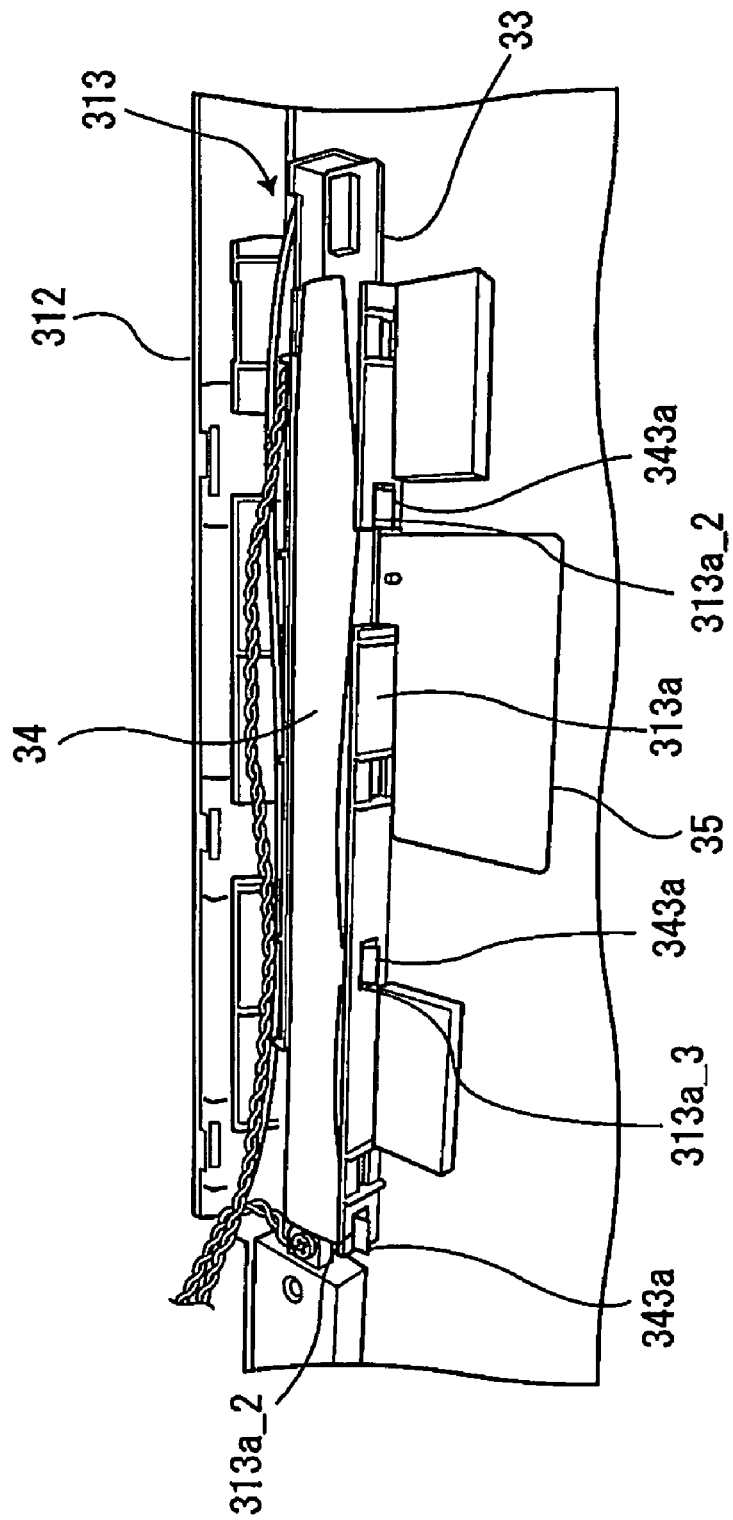
FIG. 28 is an enlarged view of an inverter circuit board in a housed state.

FIG. 28 is an enlarged view of the inverter circuit board in a housed state.

Note that, in FIG. 28, the liquid crystal panel 32 is detached from the lower panel 312.

As described above, in the lower panel 312, the concave section 313 is provided, which is surrounded by multiple ribs including the liquid crystal side rib 313a. Moreover, the inverter circuit board 33 is housed in the concave section 313 in the state of being covered with the retaining sheet 34.

Here, in this embodiment, the retaining sheet 34 covering the inverter circuit board 33 retains the inverter circuit board 33 within the concave section 313.

Figure 29:
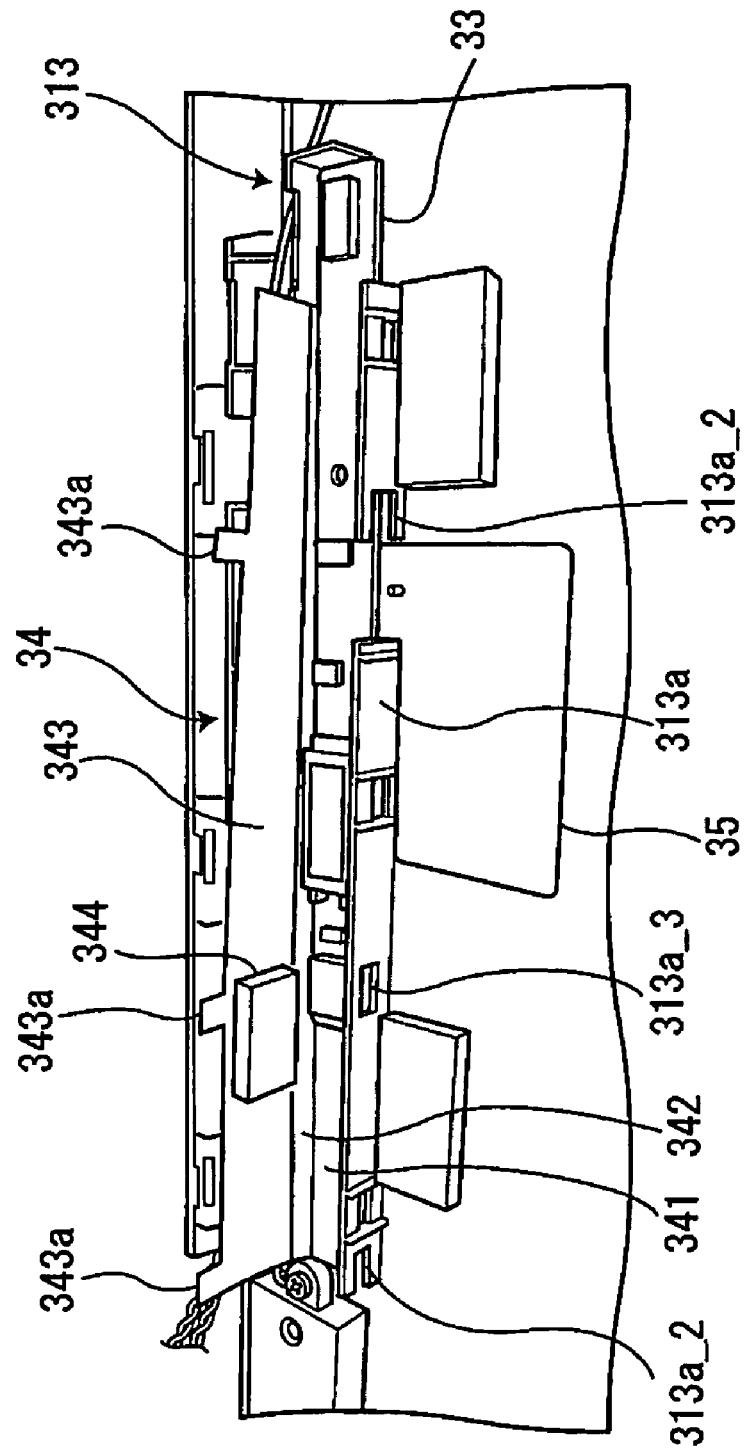
FIG. 29 illustrates a state where a portion, covering an upper side of the inverter circuit board, in a retaining sheet covering the inverter circuit board is opened.
Figure 30:
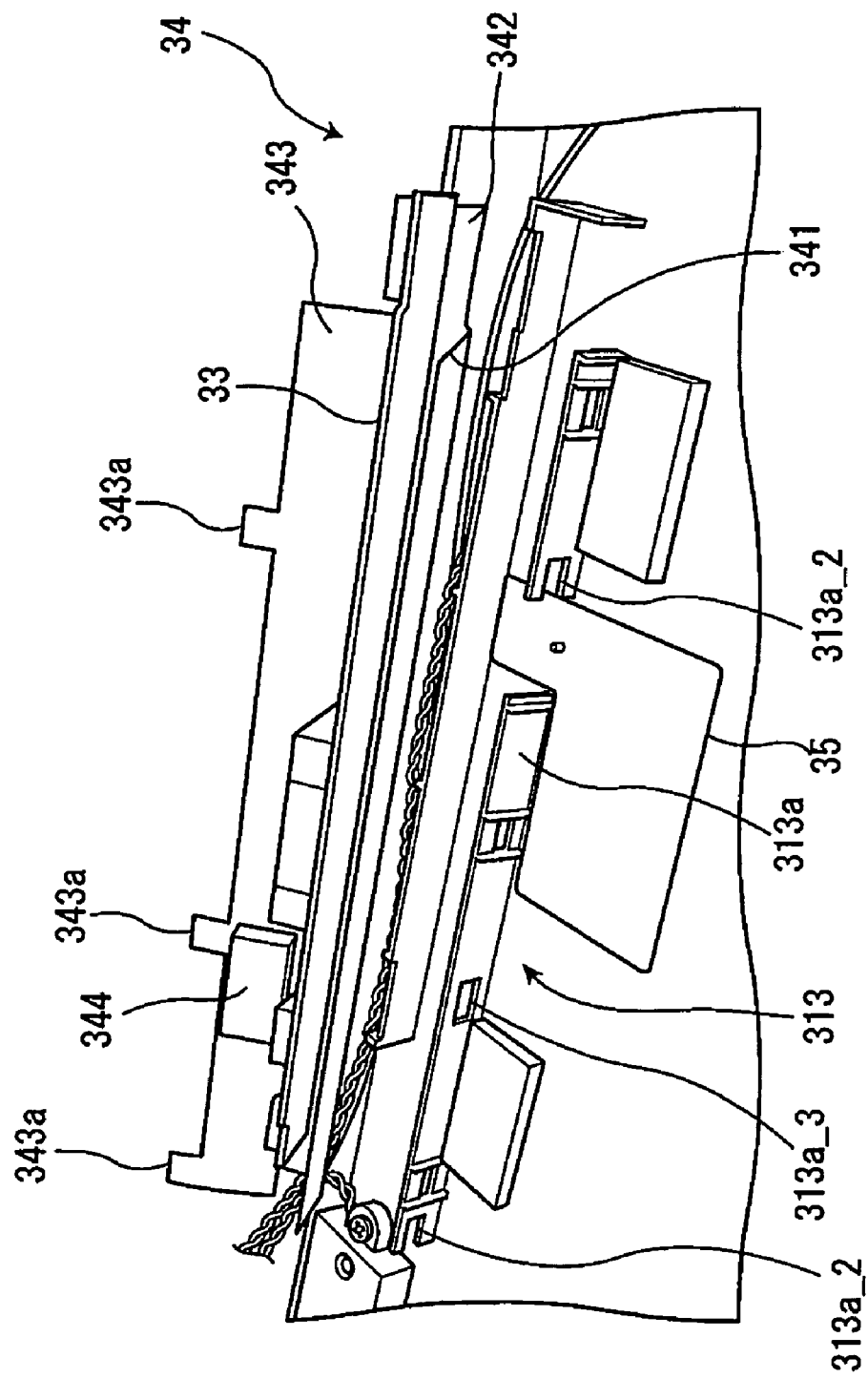
FIG. 30 illustrates a state where the inverter circuit board is taken out of a concave section together with the retaining sheet.

FIG. 29 illustrates a state where a portion, covering an upper side of the inverter circuit board, in the retaining sheet covering the inverter circuit board is opened. FIG. 30 illustrates a state where the inverter circuit board is taken out of the concave section 313 together with the retaining sheet.

The retaining sheet 34 has a bottom portion 341, a side portion 342 and an upper portion 343. The bottom portion 341 covers a rear surface of the inverter circuit board 33, which is opposed to a component mounting surface, and is provided between the rear surface of the inverter circuit board 33 and a bottom of the concave section 313. The side portion 342 is bent toward the component mounting surface from the bottom portion 341. The upper portion 343 is bent from the side portion 342 so as to cover the component mounting surface.

In housing of the inverter circuit board 33, a surface of the bottom portion 341 on the bottom side of the concave section 313 is attached to the bottom of the concave section 313 with a double-sided tape.

Moreover, three rectangular protrusions 343a are provided on an edge of the upper portion 343. Moreover, two cutouts 313a_2 and one protrusion hole 313a_3 are provided on the liquid crystal side rib 313a among the ribs forming the concave section 313. In housing of the inverter circuit board 33, the two left and right protrusions 343a among the three protrusions 343a are fitted into the two cutouts 313a_2 as illustrated in FIG. 28. Moreover, in housing of the inverter circuit board 33, the center protrusion 343a among the three protrusions 343a is fitted into the one protrusion hole 313a_3 as illustrated in FIG. 28. Furthermore, a cushion member 344 for elastically pressing the inverter circuit board 33 is attached to a surface of the upper portion 343 on the inverter circuit board 33 side.

When the inverter circuit board 33 is housed in the concave section 313 in the state of being covered with the retaining sheet 34 as illustrated in FIG. 28, there occur the following actions: the bottom portion 341 is attached to the bottom of the concave section 313; the edge of the upper portion 343 is locked by fitting the three protrusions 343a into the cutouts 313a_2 and the protrusion hole 313a_3; and the inverter circuit board 33 is pressed by the cushion member 344. With these actions, the inverter circuit board 33 is retained in the concave section 313.

In this embodiment, a metal radiator plate 35 for diffusing heat produced by the inverter circuit board 33 is attached to the lower panel 312, and a part of the radiator plate 35 extends into the concave section 313. Further, the bottom portion 341 of the retaining sheet 34 made of an insulating material of the PET film also has a function of insulating the radiator plate 35 and the inverter circuit board 33 from each other.

Here, it is conceivable to allow the retaining sheet 34 to have other functions than the insulating function unlike this embodiment.

As a conceivable example, a retaining sheet of a different structure may be formed of a so-called graphite sheet that is a resin material containing graphite and has a good thermal diffusion property to diffuse heat produced by the inverter circuit board. Further, as another conceivable example, a retaining sheet of a different structure may be formed of a so-called radio wave absorbing sheet that is a resin material containing ferrite and has a good radio wave absorbing property to absorb electromagnetic noise generated by the inverter circuit board. Here, in the graphite sheet or the radio wave absorbing sheet, graphite or ferrite contained in the corresponding resin material is conductive. Thus, in order to secure insulation properties in each of the sheets, insulating layers made of an insulating material such as PET are generally formed on both surfaces of each sheet.

Incidentally, the liquid crystal panel 32 of this embodiment illustrated in FIG. 26 is a single-lamp liquid crystal panel using one fluorescent lamp as a backlight. The inverter circuit board 33 is a single-lamp inverter circuit board corresponding to the single-lamp liquid crystal panel.

Generally, as the liquid crystal panel used in the notebook personal computer, other than the single-lamp liquid crystal panel, there is a double-lamp liquid crystal panel using two fluorescent lamps. Since the single-lamp liquid crystal panel and the double-lamp liquid crystal panel often have the same external shape or the like, a common housing that allows the both types of liquid crystal panels to be attached thereto is desired in terms of reduction in manufacturing cost, and the like.

On the other hand, external dimensions and the like of the inverter circuit board often differ between the single-lamp type and a double-lamp type. Conventionally, the inverter circuit board is often retained in the housing by screwing or the like. Thus, in many cases, screwing positions or the like for retaining the inverter circuit board differ between the single-lamp type and the double-lamp type. Therefore, conventionally, such a difference becomes a factor that hinders realization of the housing that may be commonly used for the single-lamp type and the double-lamp type.

Meanwhile, in this embodiment, as a method for retaining the inverter circuit board 33, the method for covering the inverter circuit board 33 with the retaining sheet 34 is adopted as described above. Thus, a conventional structure such as screw holes for retaining the inverter circuit board, which hinders common use of the housing between the single-lamp type and the double-lamp type, is no longer required in the display housing 31 of the display unit 30. As a result, in this embodiment, a double-lamp inverter circuit board is housed and retained in the concave section 313 for housing the single-lamp inverter circuit board 33 to be described below.

Figure 31:
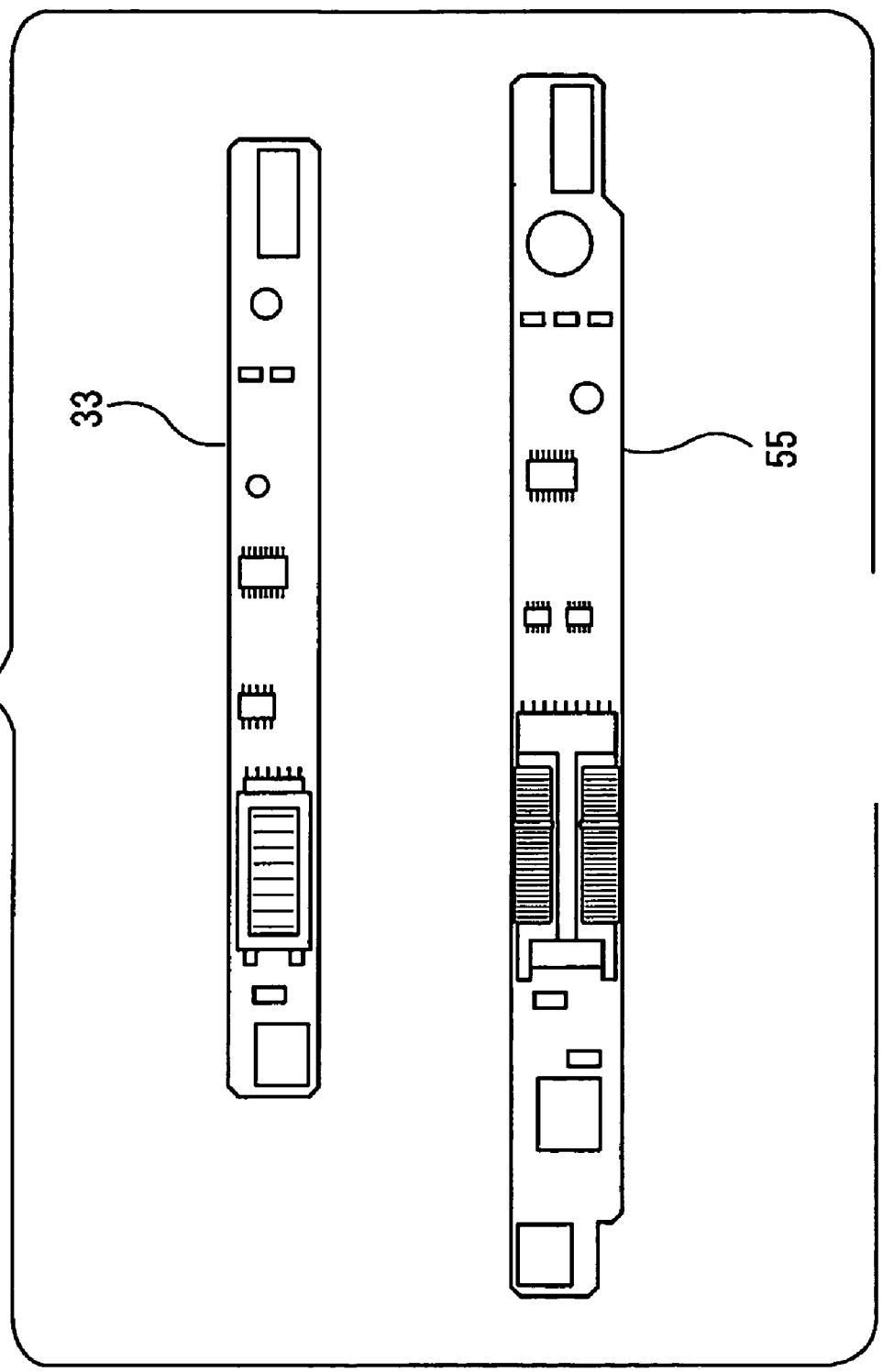
FIG. 31 illustrates a state where a single-lamp inverter circuit board also illustrated in FIG. 29 and the like and a double-lamp inverter circuit board are laid out.
Figure 32:
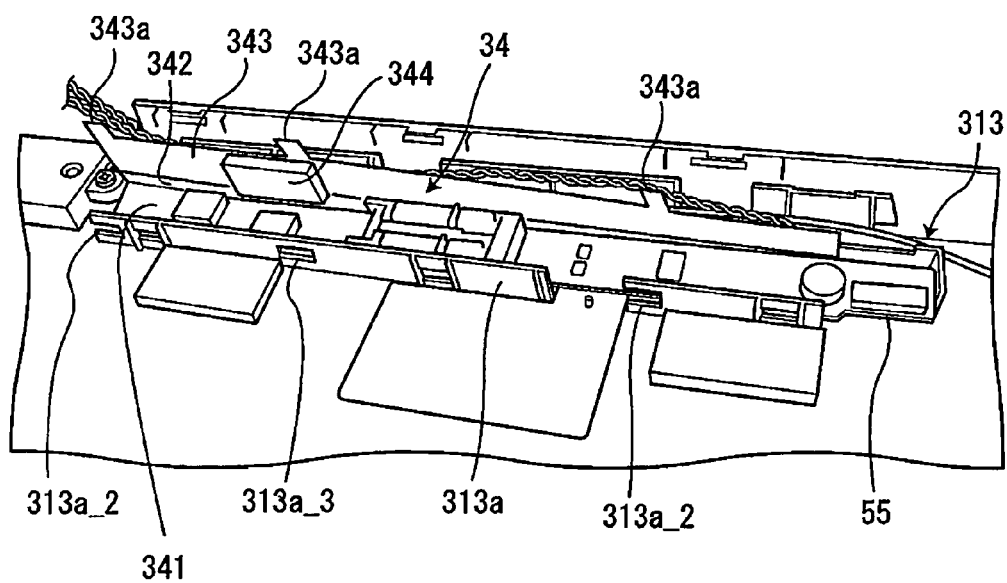
FIG. 32 illustrates a state where the double-lamp inverter circuit board is housed in the concave section for housing the single-lamp inverter circuit board.

FIG. 31 illustrates a state where the single-lamp inverter circuit board also illustrated in FIG. 29 and the like and the double-lamp inverter circuit board are laid out. FIG. 32 illustrates a state where the double-lamp inverter circuit board is housed in the concave section for housing the single-lamp inverter circuit board.

As illustrated in FIG. 31, a double-lamp inverter circuit board 55 is longer and slightly wider than the single-lamp inverter circuit board 33, which is adopted in this embodiment, due to differences in sizes and types of mounted components, the number thereof and the like therebetween.

Here, as illustrated in FIG. 29 or the like, in this embodiment, the concave section 313 is formed to be slightly wider than the single-lamp inverter circuit board 33. In this embodiment, the cushion member 344 attached to the upper portion 343 of the retaining sheet 34 also functions to prevent the single-lamp inverter circuit board 33 from moving within the wide concave section 313. The width of the concave section 313 is designed with regard to the double-lamp inverter circuit board 55 which may possibly be housed therein. Thus, the concave section 313 has the width that allows the double-lamp inverter circuit board 55 to be just fitted therein as illustrated in FIG. 32.

For housing and retaining the double-lamp inverter circuit board 55, the retaining sheet 34 used for housing and retaining the single-lamp inverter circuit board 33 is used as it is as illustrated in FIG. 32.

Specifically, the bottom portion 341 of the retaining sheet 34 is attached to the bottom of the concave section 313 with a double-sided tape, and the upper portion 343 covers a component mounting surface of the double-lamp inverter circuit board 55. Moreover, the three protrusions 343a are fitted into the two cutouts 313a_2 and the one protrusion hole 313a_3 in the liquid crystal side rib 313a. In this event, the cushion member 344 attached to the upper portion 343 elastically presses the double-lamp inverter circuit board 55. Thus, the double-lamp inverter circuit board 55 is retained in the concave section 313 as in the case of the single-lamp inverter circuit board 33.

As described above, in this embodiment, the display housing 31 having the single-lamp liquid crystal panel 32 and the single-lamp inverter circuit board 33 mounted therein may also be used for the double-lamp liquid crystal panel and the double-lamp inverter circuit board 55. Thus, unlike the conventional case, it is no longer required to prepare housings for the respective types. As a result, manufacturing cost may be reduced.

Note that the notebook personal computer 10 has been described above as an example of the electronic device. However, the electronic device of the present invention is not limited thereto. The electronic device may be other types of personal computers such as a desktop type or a laptop type, or may be a computer more sophisticated than the personal computer. Alternatively, the electronic device is not limited to the computer but may be household electrical appliances or the like.

As described above, according to the embodiments, it is possible to obtain a cooling unit that efficiently cools two or more heat-producing elements, and also to realize an electronic device mounted with such a cooling unit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling unit comprising:
a heat radiating section;
a pump;
a first heat absorbing section configured to contact a first heat-producing element and absorb heat from the first heat-producing element;
a second heat absorbing section configured to contact a second heat-producing element and absorb heat from the second heat-producing element, the second heat-producing element producing heat less than the first heat-producing element; and
a path in which coolant flows by the pump and circulates the coolant so that the coolant leaves the heat radiating section and returns to the heat radiating section, wherein
the path flows the coolant flowed out from the pump to the first heat absorbing section, flows the coolant through the first heat absorbing section to the heat radiating section, flows the coolant through the heat radiating section to the second heat absorbing section, and flows the coolant through the second heat absorbing section, without running through the heat radiating section, to the pump using a circulation path connecting the second heat absorbing section directly to the pump.

2. The cooling unit according to claim 1, wherein the second heat absorbing section includes a plurality of heat absorbing sections, the second heat-producing element includes a plurality of heat-producing elements, the plurality of heat absorbing sections contact the plurality of heat-producing elements respectively and being disposed upstream from the pump and downstream from the heat radiating section on the path.

3. The cooling unit according to claim 1, further comprising a fan that blows air to the heat radiating section.

4. The cooling unit according to claim 1, wherein the heat radiating section includes a plurality of fins, the plurality of fins coming into contact with the path.

5. An electronic device comprising:
a first heat-producing element;
a second heat-producing element that produces heat less than the first heat-producing element; and
a cooling unit that radiates heat from the first heat-producing element and the second heat-producing element, wherein the cooling unit comprises:
a heat radiating section,
a pump,
a first heat absorbing section configured to contact the first heat-producing element and absorb heat from the first heat-producing element,
a second heat absorbing section configured to contact the second heat-producing element and absorb heat from the second heat-producing element producing heat less than the first heat-producing element, and
a path in which coolant flows by the pump and circulates the coolant so that the coolant leaves the heat radiating section and returns to the heat radiating section, wherein the path flows the coolant flowed out from the pump to the first heat absorbing section, flows the coolant through the first heat absorbing section to the heat radiating section, flows the coolant through the heat radiating section to the second heat absorbing section, and flows the coolant through the second heat absorbing section, without running through the heat radiating section, to the pump using a circulation path connecting the second heat absorbing section directly to the pump.

6. The electronic device according to claim 5, wherein the second heat absorbing section includes a plurality of heat absorbing sections, the second heat-producing element includes a plurality of heat-producing elements, the plurality of heat absorbing sections contact the plurality of heat-producing sections respectively and being disposed upstream from the pump and downstream from the heat radiating section in the flow of the coolant on the path.

7. The electronic device according to claim 5, wherein the cooling unit further comprises a fan that blows air to the heat radiating section.

8. The electronic device according to claim 5, wherein the heat radiating section includes a plurality of fins, the plurality of fins coming into contact with the path.

9. A cooling unit comprising:
a heat radiating section;
a pump;
a first heat absorbing section configured to contact a first heat-producing element and absorb heat from the first heat-producing element;
a second heat absorbing section configured to contact a second heat-producing element and absorb heat from the second heat-producing element, the second heat-producing element producing heat less than the first heat-producing element; and
a path in which coolant flows by the pump and circulates the coolant so that the coolant leaves the heat radiating section and returns to the heat radiating section, wherein
the path flows the coolant flowed out from the pump to the first heat absorbing section, flows the coolant through the first heat absorbing section to the heat radiating section, flows the coolant through the heat radiating section to the second heat absorbing section, and flows the coolant through the second heat absorbing section, without running through the heat radiating section, to the pump using a circulation path connecting the second heat absorbing section directly to the pump, and
the coolant that includes a heat conducted from the second heat absorbing section and flows through the second heat absorbing section without running through the heat radiating section to the pump endures a transfer of heat produced by the first heat radiating section and absorbed by the first heat absorbing section.

10. The cooling unit according to claim 9, wherein the second heat absorbing section includes a plurality of heat absorbing sections, the second heat-producing element includes a plurality of heat-producing elements, the plurality of heat absorbing sections contact the plurality of heat-producing elements respectively and being disposed upstream from the pump and downstream from the heat radiating sections on the path.

11. The cooling unit according to claim 9, further comprising a fan that blows air to the heat radiating section.

12. The cooling unit according to claim 9, wherein the heat radiating section includes a plurality of fins, the plurality of fins coming into contact with the path.

* * * * *